United States Patent
Sun

(10) Patent No.: US 10,001,536 B2
(45) Date of Patent: Jun. 19, 2018

(54) SYSTEM AND METHOD FOR MEASURING PH USING MAGNETIC RESONANCE

(71) Applicant: Phillip Zhe Sun, Waltham, MA (US)

(72) Inventor: Phillip Zhe Sun, Waltham, MA (US)

(73) Assignee: The General Hospital Corporation, Boston, MA (US)

( * ) Notice: Subject to any disclaimer, the term of this patent is extended or adjusted under 35 U.S.C. 154(b) by 423 days.

(21) Appl. No.: 14/705,898

(22) Filed: May 6, 2015

(65) Prior Publication Data

US 2015/0323632 A1 Nov. 12, 2015

Related U.S. Application Data

(60) Provisional application No. 61/988,971, filed on May 6, 2014.

(51) Int. Cl.
*G01V 3/00* (2006.01)
*G01R 33/48* (2006.01)
*G01R 33/56* (2006.01)
*G01R 33/483* (2006.01)

(52) U.S. Cl.
CPC ....... *G01R 33/4804* (2013.01); *G01R 33/483* (2013.01); *G01R 33/4828* (2013.01); *G01R 33/5601* (2013.01); *G01R 33/5608* (2013.01); *G01R 33/5605* (2013.01)

(58) Field of Classification Search
CPC ............ G01R 33/4804; G01R 33/4828; G01R 33/483; G01R 33/5601; G01R 33/5608
See application file for complete search history.

(56) References Cited

PUBLICATIONS

Sun et al., Simultaneous experimental determination of labile proton fraction ratio and exchange rate with irradiation radio frequency power-dependent quantitative CEST MRI analysis, Contrast Media Mol Imaging, 8(3), 246-251 2013, first published Feb. 4, 2014.*

* cited by examiner

*Primary Examiner* — Daniel Miller
(74) *Attorney, Agent, or Firm* — Quarles & Brady LLP

(57) ABSTRACT

Systems and methods for indicating pH in a subject using a magnetic resonance imaging (MRI) system are provided. The method includes selecting a contrast agent, generating a chemical exchange saturation transfer (CEST) pulse sequence, performing the pulse sequence with the saturating pulse at a first power level, and performing the pulse sequence again with the saturating pulse at a power level different from the first power level. The method also includes generating values indicating pH of the subject, and generating a report indicating the pH using those values.

20 Claims, 17 Drawing Sheets

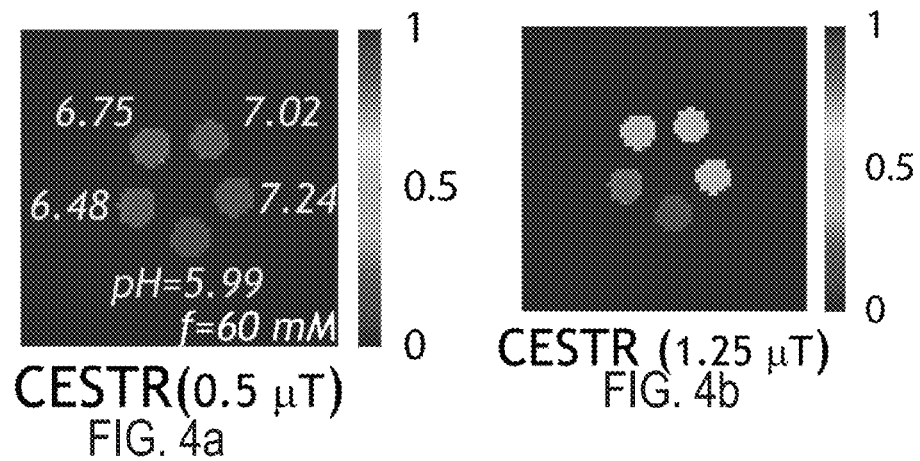
CESTR(0.5 μT)
FIG. 4a
CESTR (1.25 μT)
FIG. 4b
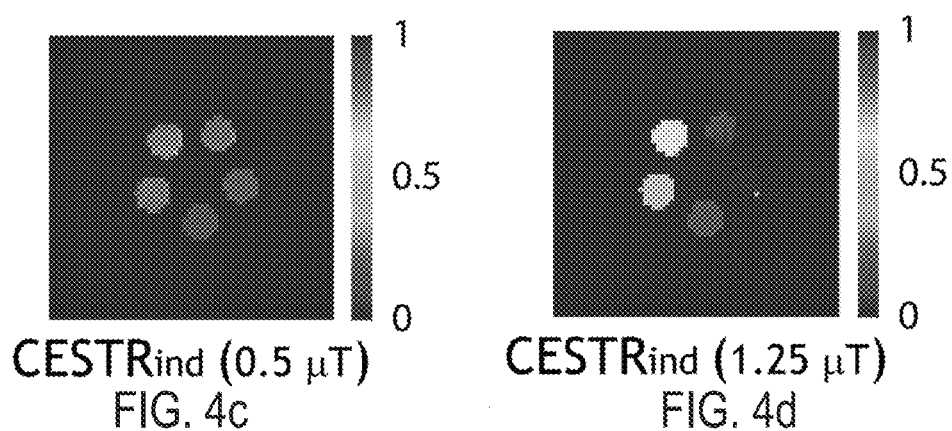
CESTRind (0.5 μT)
FIG. 4c
CESTRind (1.25 μT)
FIG. 4d
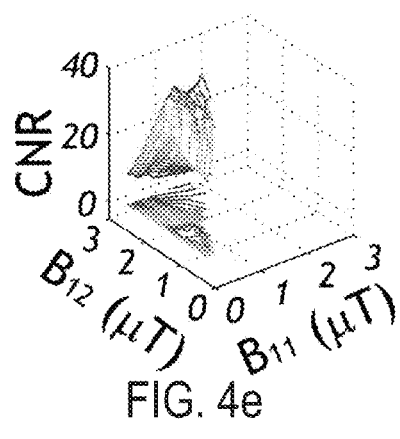
FIG. 4e
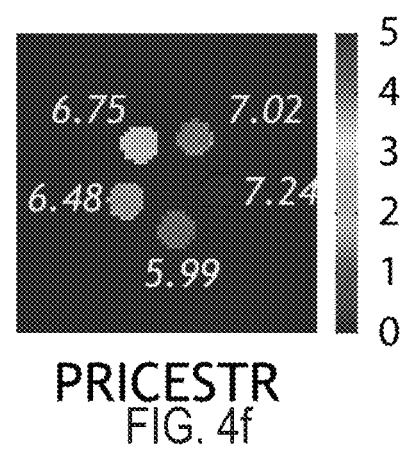
PRICESTR
FIG. 4f

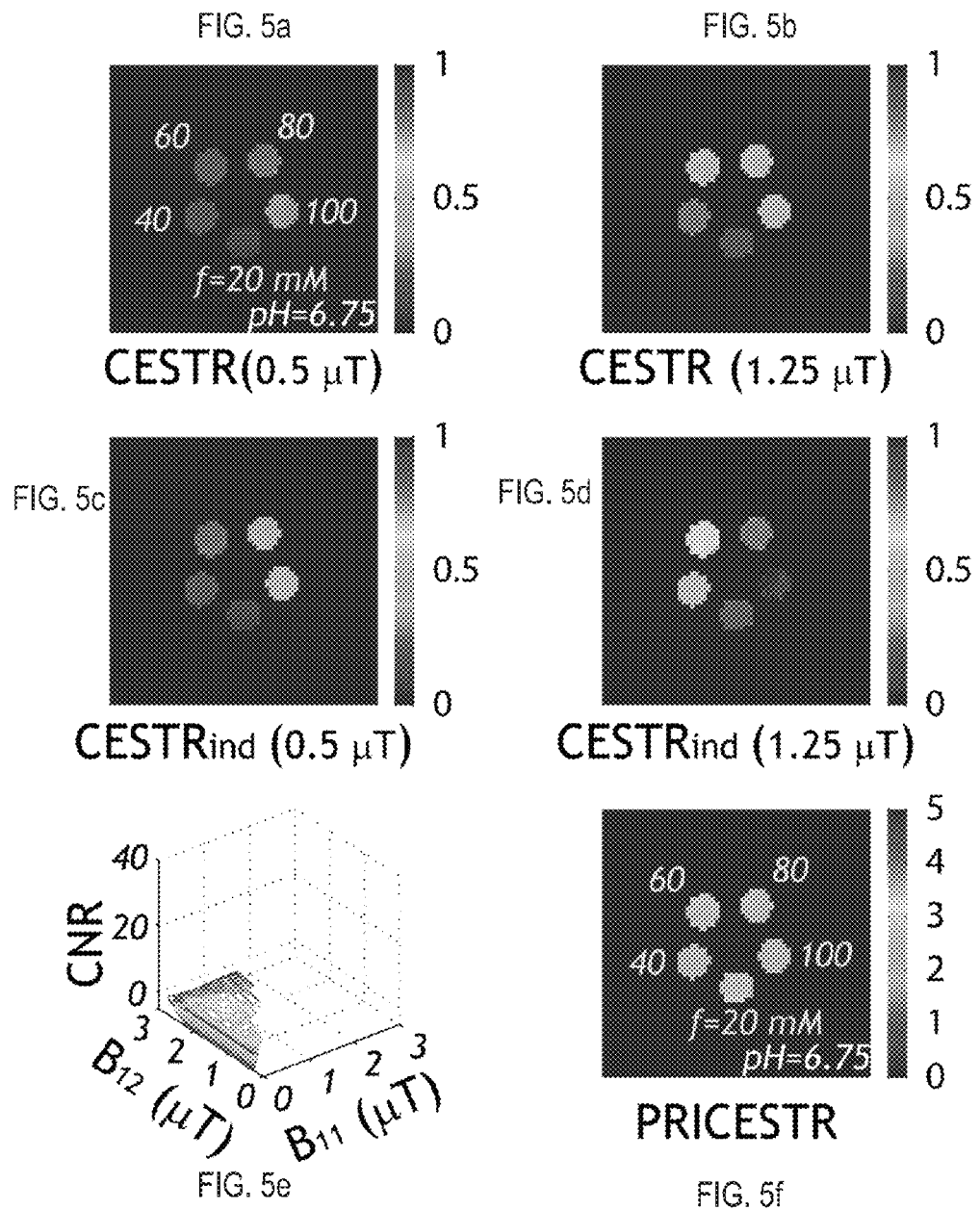

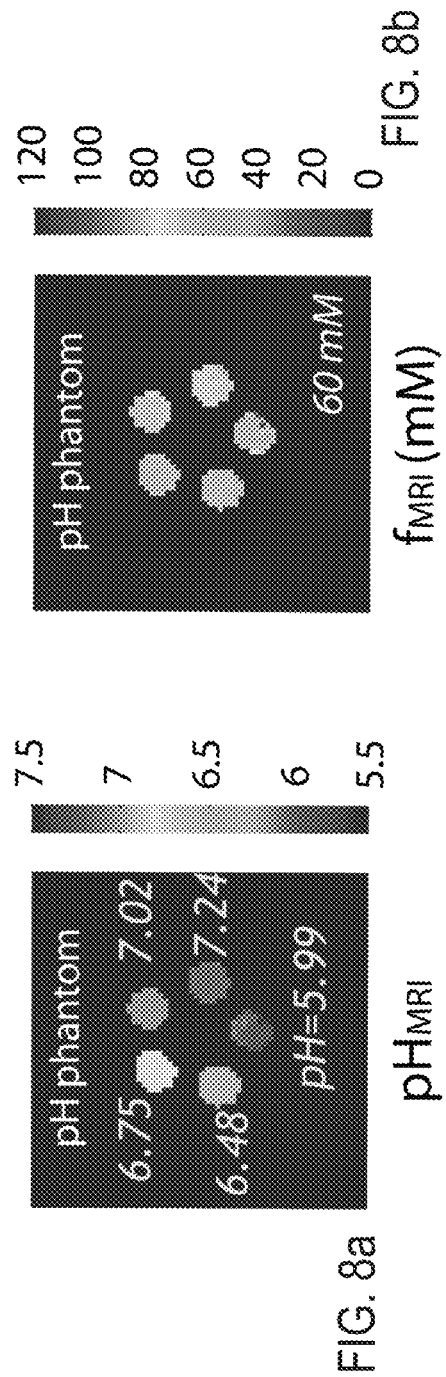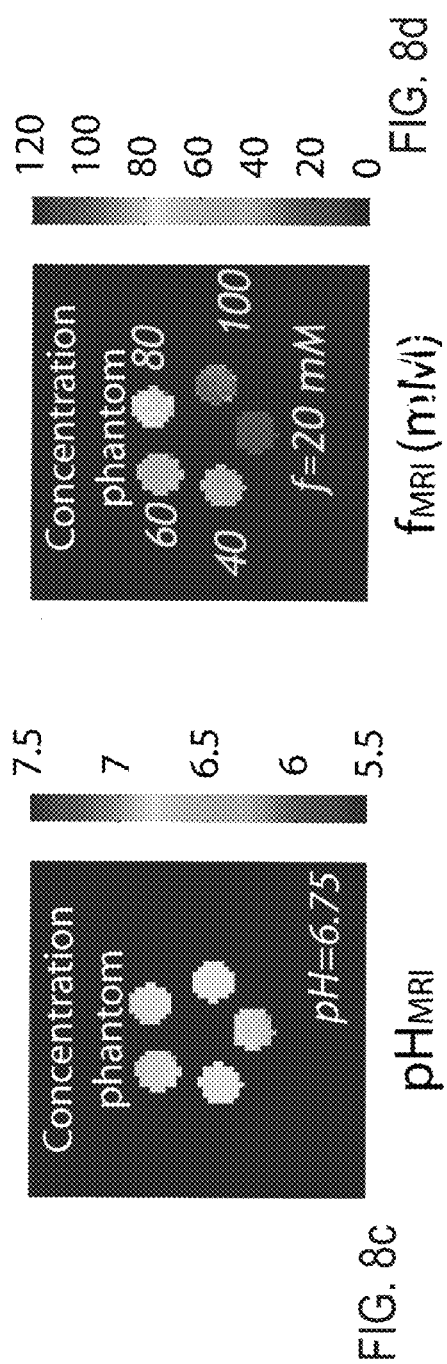
FIG. 8a
FIG. 8b
FIG. 8c
FIG. 8d

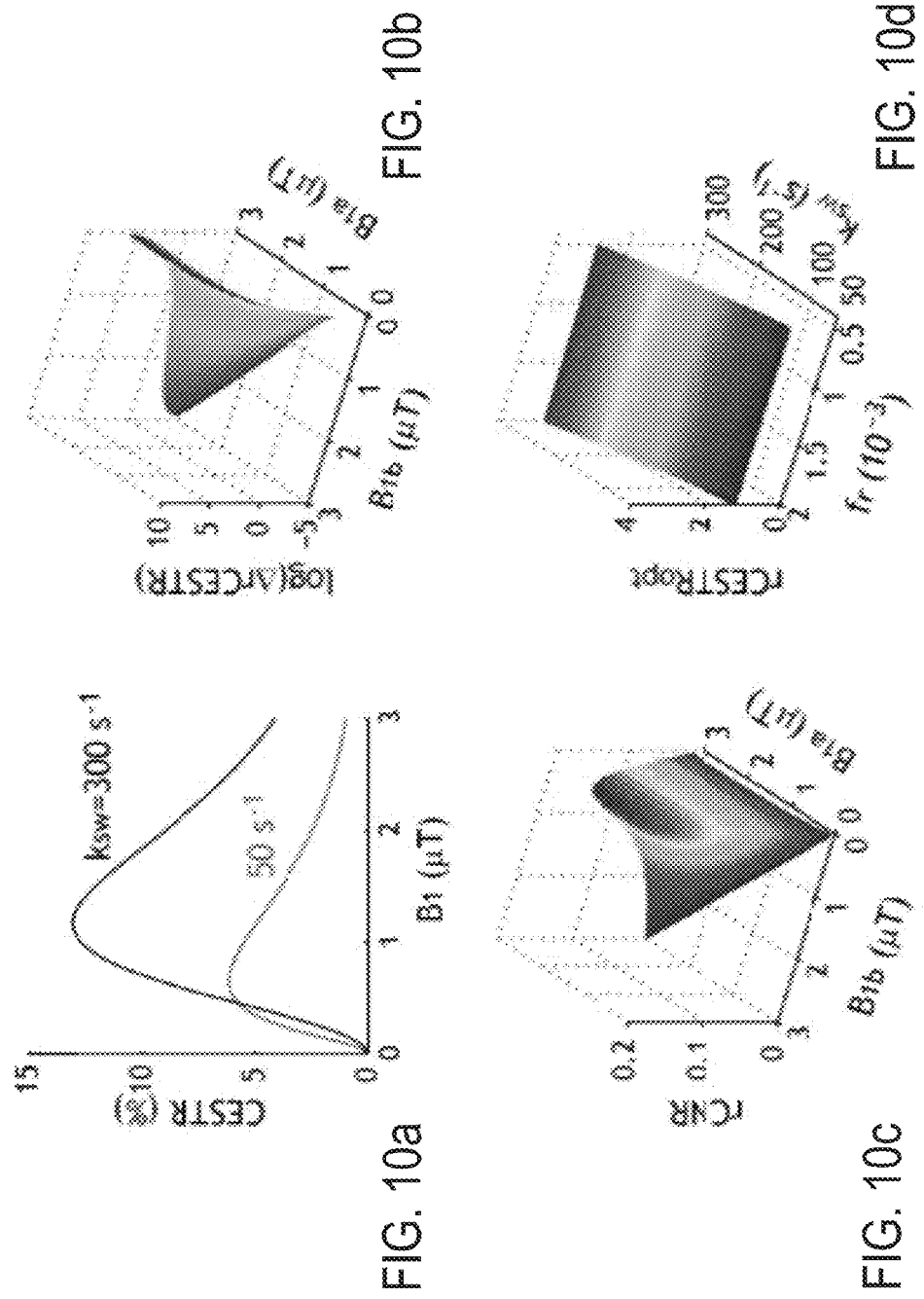

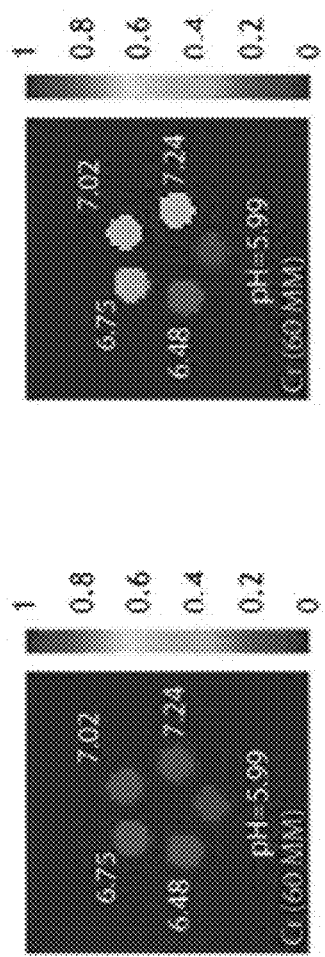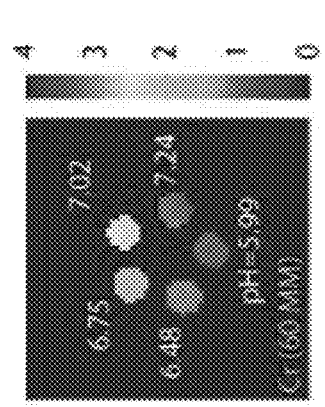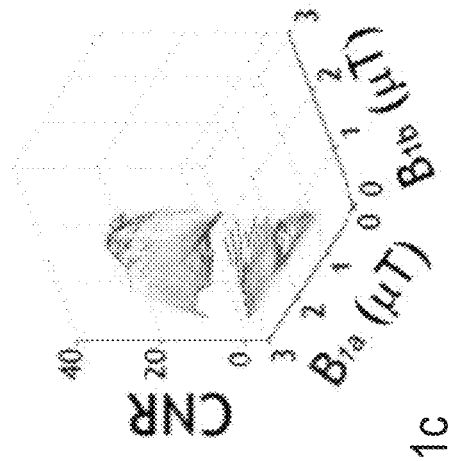
FIG. 11a  FIG. 11b  FIG. 11c  FIG. 11d

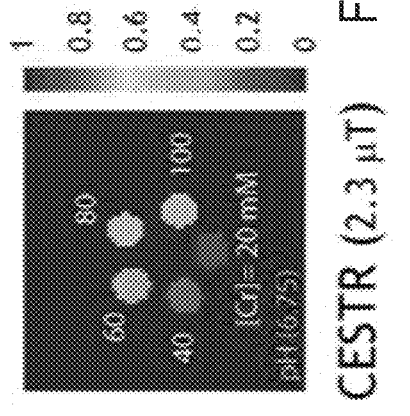
FIG. 12a  FIG. 12b
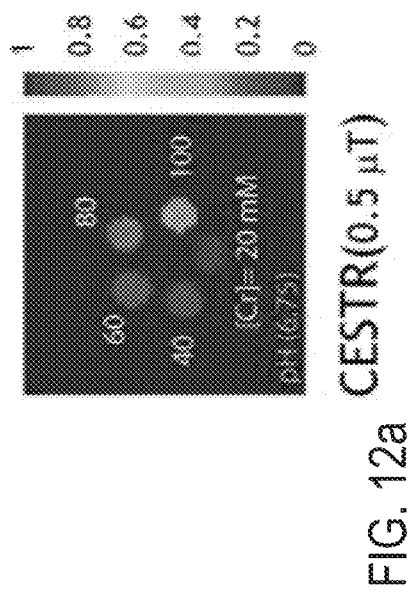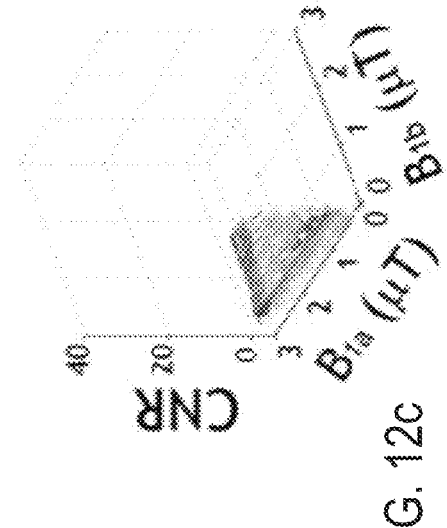
FIG. 12c  FIG. 12d

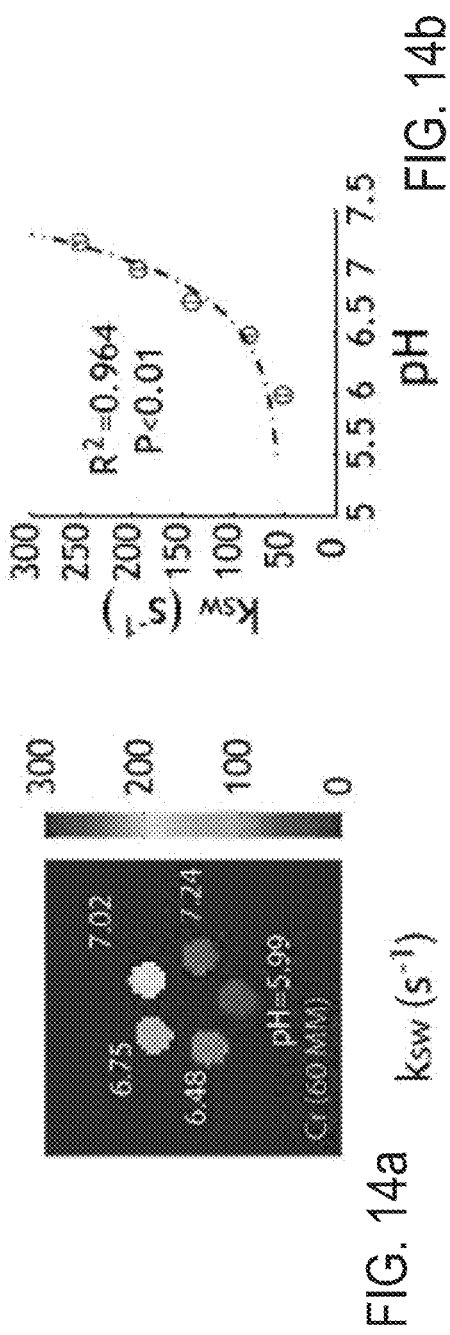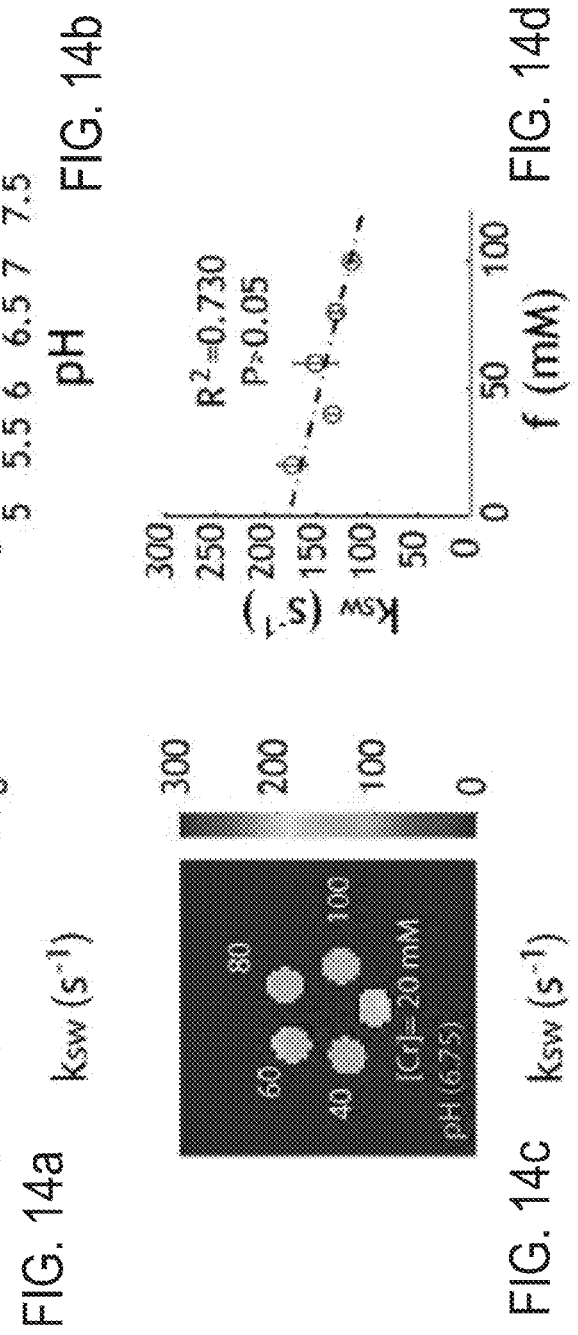
FIG. 14a  FIG. 14b  FIG. 14c  FIG. 14d

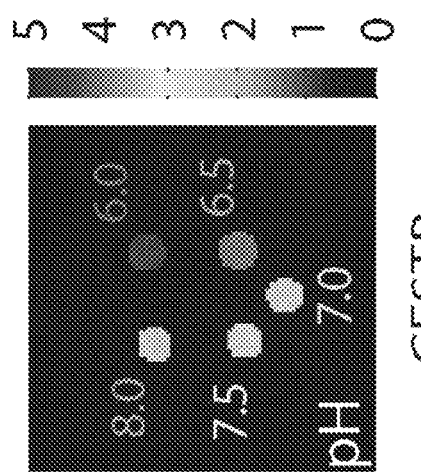
FIG. 17a rCESTR
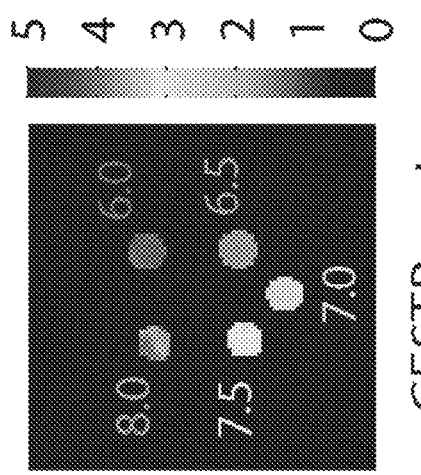
FIG. 17b rCESTRmod
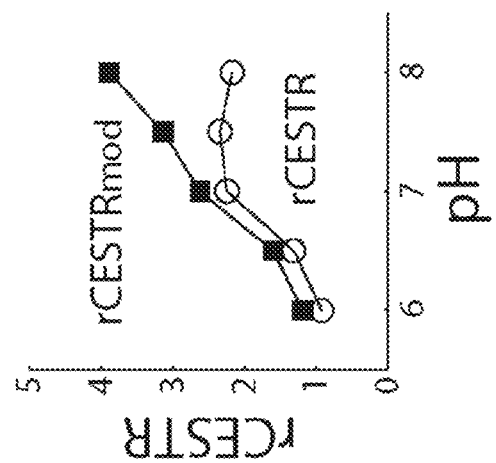
FIG. 17c

SYSTEM AND METHOD FOR MEASURING PH USING MAGNETIC RESONANCE

CROSS REFERENCE

This application is based on, claims priority to, and incorporates herein by reference in its entirety, U.S. Provisional Patent Application Ser. No. 61/988,971, filed on May 6, 2014, and entitled "Concentration-Independent pH Imaging."

STATEMENT REGARDING FEDERALLY-SPONSORED RESEARCH

This invention was made with government support under grant numbers EB009771, RR014075 and NS083654 awarded by the National Institutes of Health. The government has certain rights in this invention.

BACKGROUND

Chemical exchange saturation transfer (CEST) magnetic resonance imaging (MRI) is one of the methods to increase the MRI sensitivities by exploiting CEST effects, where the signals of water protons change due to the exchange between exchangeable protons and water protons. The CEST effects are sensitive to exchange rates, which are often pH-dependent. As such, a CEST MRI can be used to noninvasively image pH.

There are many CEST contrast agents that can be used for pH imaging. Some have more than one exchangeable sites (e.g., iopamidol, iopromide); some have a single exchangeable site (e.g., iobitridol, iohexol, and creatine). Composite amide and amine protons from endogeneous composite proteins or peptides can also be used for pH imaging.

Indeed, pH MRI has been applied to investigate pH changes in disorders such as acute stroke and renal injury. However, in addition to being pH dependent, the CEST effect also varies with CEST agent concentration, relaxation rates, and experimental conditions, all of which limit the pH specificity of CEST imaging. For example, quantification of exchange rate with saturation power (QUESP), time (QUEST), and time with ratiometric analysis (QUESTRA) are sensitive to labile proton ratio-weighted exchange rate, their specificity may be limited without knowledge of CEST agent concentration.

One way to decrease the effects of concentration in CEST imaging is through ratiometric CEST imaging by analyzing the relative CEST effects from multiple exchangeable groups. This method substantially simplifies pH determination, but is limited to CEST agents with at least two chemically distinguishable exchangeable sites. Another drawback of this method is that the power level of the saturating radio frequency pulse is not optimal because ratios of CEST measurements from multiple sites using the same $B_1$ field are generated. The optimal $B_1$ level depends on exchange rates, pH, the chemical shift from bulk tissue water, and the difference between chemical shifts of exchangeable sites. As such, the applied $B_1$ may not be optimal for any site, and the precision of measured pH values is compromised.

It would be desirable to have a system and method for pH imaging independent from concentration of the contrast agent, applicable to agents with only one exchangeable site or with multiple exchangeable sites, and with an optimized sensitivity and extended range.

SUMMARY

The present disclosure overcomes the aforementioned drawbacks by providing a system and method for measuring pH values of a subject by using magnetic resonance (MR) signals acquired with two or more different radio frequency (RF) power levels in the saturating pulse in a chemical exchange saturation transfer (CEST) pulse sequence. Exchange rates and pH values can be derived from the ratio of CEST effects (CESTR) or inverse difference of CEST effects (CESTRind) at different RF power levels. Other parameters affecting exchange rates can also be derived.

In accordance with one aspect of the disclosure, a method is provided for assessing pH in a subject using a magnetic resonance imaging (MRI) system. The method includes generating, using the MRI system, a CEST pulse sequence comprising a saturating magnetic field used to saturate protons of the subject by irradiating the subject with the field, wherein the field has a frequency offset from a Lamar frequency of water protons, and the frequency offset is related to the contrast agent associated with the subject. The method includes performing the pulse sequence wherein the saturating magnetic field is at a first RF power level ($\omega_{11}$) and a first set of MR signals of the subject are acquired. The method further includes performing the pulse sequence wherein the saturating magnetic field is at a second RF power level ($\omega_{12}$) different from $\omega_{11}$ and a second set of MR signals are acquired. The method also generating values indicating pH of the subject using the first and the second set of MR signals and generating a report indicating the pH using the values.

In accordance with another aspect of the disclosure, an MRI system is disclosed that includes a magnet system configured to generate a polarizing magnetic field about at least a portion of a subject arranged in the MRI system and a magnetic gradient system including a plurality of magnetic gradient coils configured to apply at least one magnetic gradient field to the polarizing magnetic field. The MRI system also includes a RF system configured to apply an RF field to the subject and to receive MR signals therefrom and a computer system. The computer system is programmed to generate, using the MRI system, a CEST pulse sequence comprising a saturating magnetic field used to saturate protons of the subject by irradiating the subject with the field, wherein the field has a frequency offset from a Lamar frequency of water protons, and the frequency offset is related to a contrast agent associated with the subject. The computer system is further programmed to perform the pulse sequence wherein the saturating magnetic field is at a first RF power level ($\omega_{11}$) and a first set of MR signals of the subject are acquired. The computer system is further programmed to perform the pulse sequence wherein the saturating magnetic field is at a second RF power level ($\omega_{12}$) different from $\omega_{11}$ and a second set of MR signals are acquired. The computer system is also configured to generate values indicating pH of the subject using the first and the second set of MR signals and generate a report indicating the pH using the values.

The foregoing and other aspects and advantages of the invention will appear from the following description. In the description, reference is made to the accompanying drawings, which form a part hereof, and in which there is shown by way of illustration a preferred embodiment of the invention. Such embodiment does not necessarily represent the full scope of the invention, however, and reference is made therefore to the claims and herein for interpreting the scope of the invention.

BRIEF DESCRIPTION OF THE DRAWINGS

FIG. 4a shows a CESTR map of a pH CEST phantom with the saturating RF power level at 0.5 µT.

FIG. 4b shows a CESTR map of the pH CEST phantom with the saturating RF power level at 1.25 µT.

FIG. 4c shows a CESTRind map of the pH CEST phantom with the saturating RF power level at 0.5 µT.

FIG. 4d shows a CESTRind map of the pH CEST phantom with the saturating RF power level at 1.25 µT.

FIG. 4e shows the CNR between signals of vials with the lowest and highest pH values as a function of saturating RF power levels.

FIG. 4f shows the PRICESTR of the pH CEST phantom calculated with RF power levels at 0.5 and 1.25 µT.

FIG. 5a shows a CESTR map of a concentration CEST phantom with the saturating RF power level at 0.5 µT.

FIG. 5b shows a CESTR map of the concentration CEST phantom with the saturating RF power level at 1.25 µT.

FIG. 5c shows a CESTRind map of the concentration CEST phantom with the saturating RF power level at 0.5 µT.

FIG. 5d shows a CESTRind map of the concentration CEST phantom with the saturating RF power level at 1.25 µT.

FIG. 5e shows the CNR between signals of the vials with the lowest and highest concentrations as a function of RF power levels.

FIG. 5f shows the PRICESTR of the concentration CEST phantom calculated with saturating RF power levels at 0.5 and 1.25 µT.

FIG. 8a shows a pH map derived from the quantitative CEST MRI analysis ($pH_{MRI}$ map) of the pH phantom.

FIG. 8b shows a concentration map derived from the quantitative CEST MRI analysis ($f_{MRI}$ map) of the pH phantom.

FIG. 8c shows a $pH_{MRI}$ map of the concentration phantom.

FIG. 8d shows a $f_{MRI}$ map of the concentration phantom.

FIG. 10a shows CESTR as a function of $B_1$ level for two different exchange rates using simulation results of an rCESTR analysis.

FIG. 10b shows the logarithm of rCESTR contrast (ΔrCESTR) as a function of $B_1$ levels using simulation results of the rCESTR analysis.

FIG. 10c shows relative contrast to noise ratio (rCNR) of rCESTR as a function of B1 levels using simulation results of the rCESTR analysis.

FIG. 10d shows rCESTR under $B_1$ levels of 0.5 and 2 µT as a function of labile proton ratios and exchange rates using simulation results of the rCESTR analysis.

FIG. 11a shows a CESTR map of a pH CEST phantom with the saturating RF power level at $B_1$=0.5 µT.

FIG. 11b shows a CESTR map of the pH CEST phantom with the saturating RF power level at B1=2.3 µT.

FIG. 11c shows CNR between signals of vials in the pH CEST phantom with pH of 5.99 and 7.24 as a function of two different saturating RF power levels ($B_{1a}$ and $B_{1b}$).

FIG. 11d shows the rCESTR map of a pH CEST phantom with $B_{1a}$=2.3 and $B_{1b}$=0.5 µT.

FIG. 12a shows a CESTR map of a concentration CEST phantom with the saturating RF power level at B1=0.5 µT.

FIG. 12b shows a CESTR map of the concentration CEST phantom with the saturating RF power level at $B_1$=2.3 µT.

FIG. 12c shows the CNR between signals of vials with concentrations at 20 and 100 mM in the concentration CEST phantom.

FIG. 12d shows rCESTR map of the concentration CEST phantom with $B_{1a}$=2.3 and $B_{1b}$=0.5 µT.

FIG. 14a shows an exchange rate map for the pH phantom derived from rCESTR analysis.

FIG. 14b shows that the exchange rate can be described by a chemical exchange relation of dominantly base-catalyzed.

FIG. 14c shows an exchange rate map for the creatine concentration phantom derived from rCESTR analysis.

FIG. 14d shows the exchange rate as a function of creatine concentrations.

FIG. 17a shows conventional ratiometric (i.e. same $B_1$ at two different chemical offsets) as a function of pH.

FIG. 17b shows rCESTR as the ratio of CESTR of two different chemical shifts and two different $B_1$ as a function of pH.

FIG. 17c shows comparison of conventional ratiometrics and ratiometrics acquired with simultaneous modulation of RF saturation power and chemical shifts.

DETAILED DESCRIPTION

The system and method disclosed herein can be used with an MRI system, such as the below-described system 100.

Figure 1:
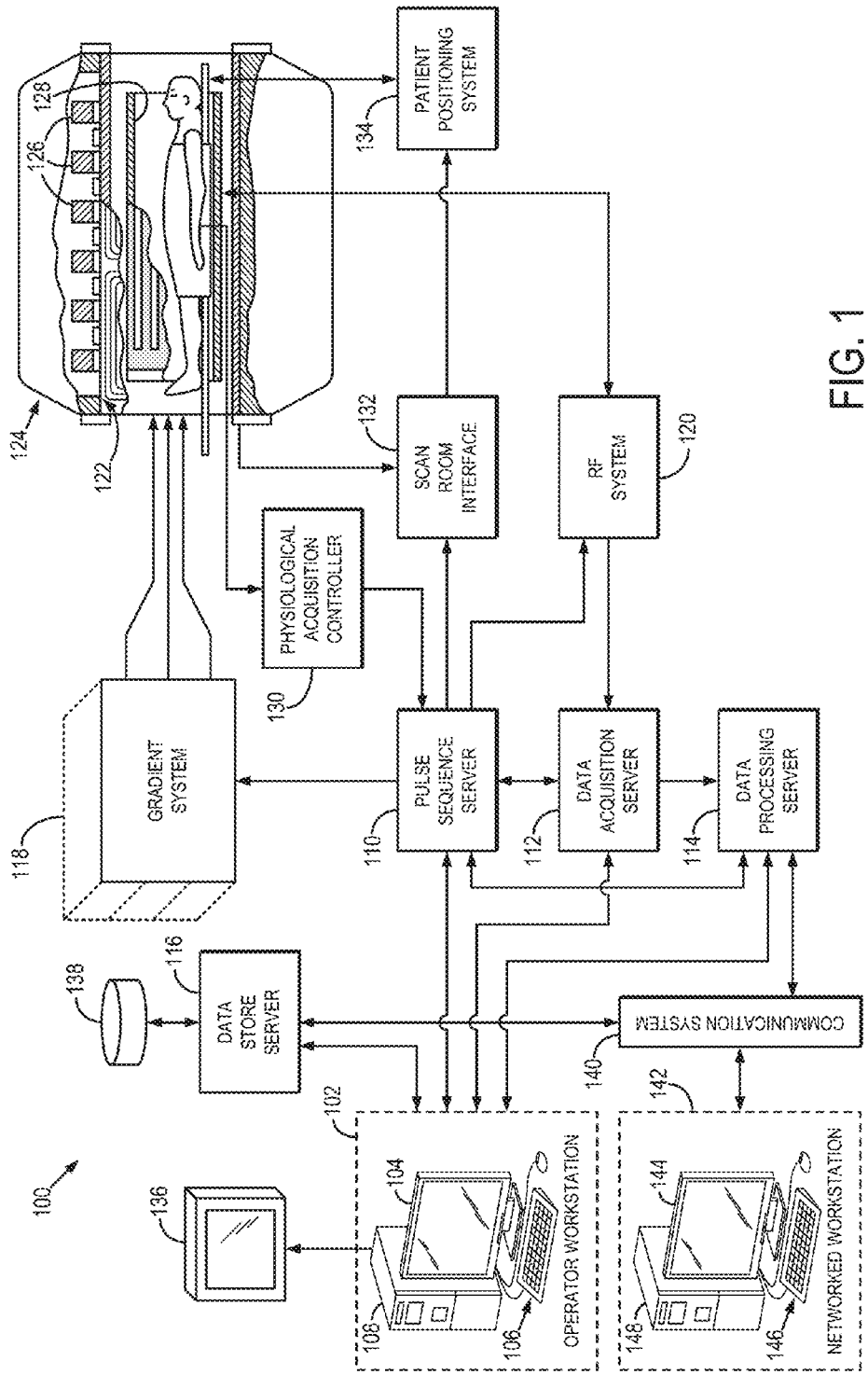
FIG. 1 is a block diagram of an example of a magnetic resonance imaging (MRI) system configured to employ the present disclosure.

Referring particularly to FIG. 1, an example of a magnetic resonance imaging (MRI) system 100 is illustrated. The MRI system 100 includes a workstation 102 having a display 104 and a keyboard 106. The workstation 102 includes a processor 108 that is commercially available to run a commercially-available operating system. The workstation 102 provides the operator interface that enables scan prescriptions to be entered into the MRI system 100. The workstation 102 is coupled to four servers: a pulse sequence server 110; a data acquisition server 112; a data processing server 114; and a data store server 116. The workstation 102 and each server 110, 112, 114, and 116 are connected to communicate with each other.

The pulse sequence server 110 functions in response to instructions downloaded from the workstation 102 to operate a gradient system 118 and a radiofrequency (RF) system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding MR signals. The gradient coil assembly 122 forms part of a magnet assembly 124 that includes a polarizing magnet 126 and a whole-body RF coil 128 (or a head (and neck) RF coil for brain imaging).

RF excitation waveforms are applied to the RF coil 128, or a separate local coil, such as a head coil, by the RF system 120 to perform the prescribed magnetic resonance pulse sequence. Responsive MR signals detected by the RF coil 128, or a separate local coil, are received by the RF system 120, amplified, demodulated, filtered, and digitized under direction of commands produced by the pulse sequence server 110. The RF system 120 includes an RF transmitter for producing a wide variety of RF pulses used in MR pulse sequences. The RF transmitter is responsive to the scan prescription and direction from the pulse sequence server 110 to produce RF pulses of the desired frequency, phase, and pulse amplitude waveform. The generated RF pulses may be applied to the whole body RF coil 128 or to one or more local coils or coil arrays.

The RF system 120 also includes one or more RF receiver channels. Each RF receiver channel includes an RF preamplifier that amplifies the MR signal received by the coil 128 to which it is connected, and a detector that detects and digitizes the quadrature components of the received MR signal. The magnitude of the received MR signal may thus be determined at any sampled point by the square root of the sum of the squares of the I and Q components:

$$M=\sqrt{I^2+Q^2} \qquad (1)$$

and the phase of the received MR signal may also be determined:

$$\varphi = \tan^{-1}\left(\frac{Q}{I}\right). \qquad (2)$$

The pulse sequence server 110 also optionally receives patient data from a physiological acquisition controller 130. The controller 130 receives signals from a number of different sensors connected to the patient, such as electrocardiograph (ECG) signals from electrodes, or respiratory signals from a bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized MR signal samples produced by the RF system 120 are received by the data acquisition server 112. The data acquisition server 112 operates in response to instructions downloaded from the workstation 102 to receive the real-time MR data and provide buffer storage, such that no data is lost by data overrun. In some scans, the data acquisition server 112 does little more than pass the acquired MR data to the data processor server 114. However, in scans that require information derived from acquired MR data to control the further performance of the scan, the data acquisition server 112 is programmed to produce such information and convey it to the pulse sequence server 110. For example, during prescans, MR data is acquired and used to calibrate the pulse sequence performed by the pulse sequence server 110. Also, navigator signals may be acquired during a scan and used to adjust the operating parameters of the RF system 120 or the gradient system 118, or to control the view order in which k-space is sampled. In all these examples, the data acquisition server 112 acquires MR data and processes it in real-time to produce information that is used to control the scan.

The data processing server 114 receives MR data from the data acquisition server 112 and processes it in accordance with instructions downloaded from the workstation 102. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 114 are conveyed back to the workstation 102 where they are stored. Real-time images are stored in a data base memory cache (not shown), from which they may be output to operator display 104 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the workstation 102. The workstation 102 may be used by an operator to archive the images, produce films, or send the images via a network or communication system 140 to other facilities that may include other networked workstations 142.

The communication system 140 and networked workstation 142 may represent any of the variety of local and remote computer systems that may be included within a given clinical or research facility including the system 100 or other, remote location that can communicate with the system 100. In this regard, the networked workstation 142 may be functionally and capably similar or equivalent to the operator workstation 102, despite being located remotely and communicating over the communication system 140. As such, the networked workstation 142 may have a display 144 and a keyboard 146. The networked workstation 142 includes a processor 148 that is commercially available to run a commercially-available operating system. The networked workstation 142 may be able to provide the operator interface that enables scan prescriptions to be entered into the MRI system 100.

Figure 2:
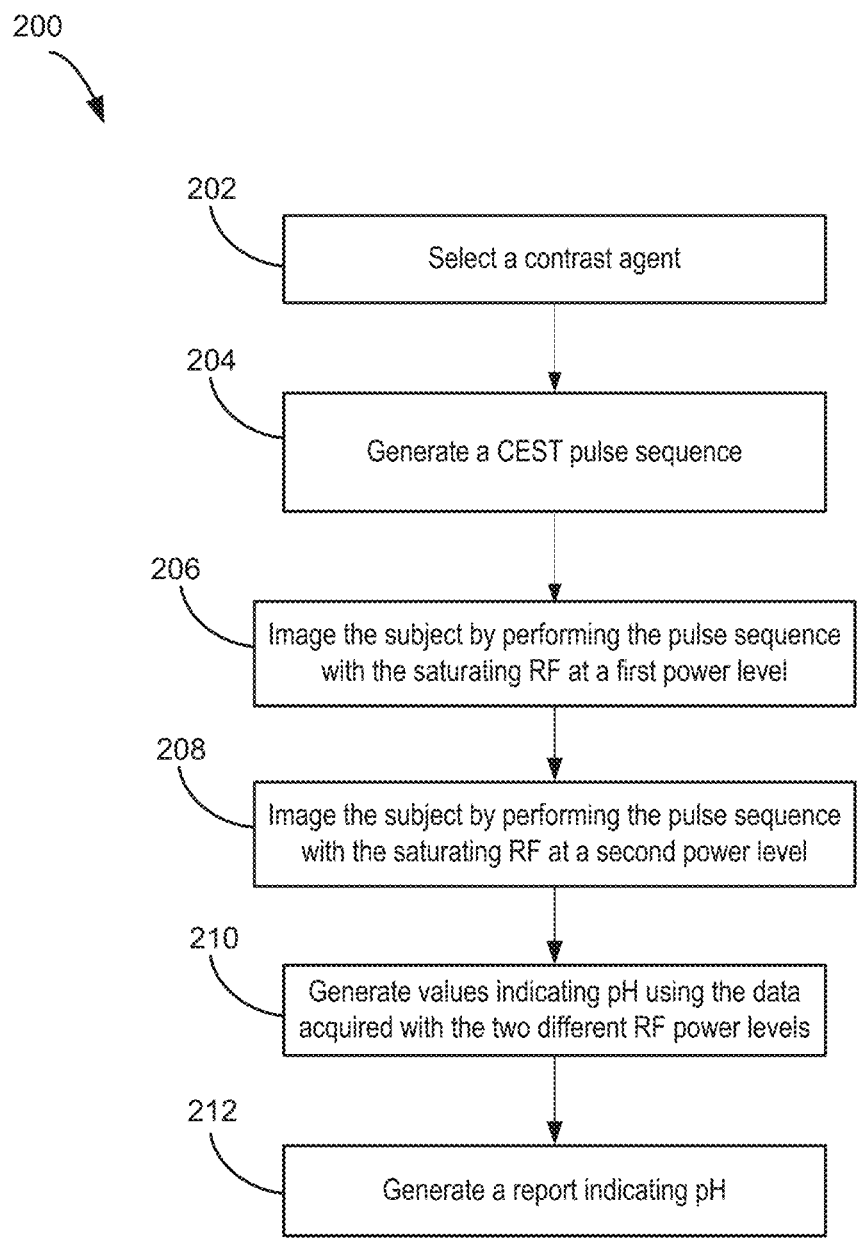
FIG. 2 is a flow chart setting forth the steps of one non-limiting example of a method for generating a report indicating pH according to the present disclosure.

Referring to FIG. 2, a flowchart 200 of an example method implemented according to the present disclosure is provided. In step 202, a contrast agent is selected. The contrast agent can be endogenous where the agent is a compound of a subject or exogenous where the agent is administered into the subject. The agent can also have a single exchangeable site or multiple sites. In step 204, a chemical exchange saturation transfer (CEST) pulse sequence is generated. An example pulse sequence is a 3-point CEST imaging sequence where the sequence has three subparts. In the first subpart, a proton of an exchangeable site of the contrast agent is saturated at the frequency offset of the proton or the exchangeable site from the Larmar frequency of water protons. This is also called a label scan. In the second subpart, a saturating pulse is applied at a frequency offset opposite of the offset in the first subpart. This is called a reference scan. In the third subpart, no saturation pulse is applied. This is called a control scan.

Still referring to FIG. 2, in step 206, the subject is imaged with the pulse sequence generated in step 204. In step 208, the subject is imaged again with the pulse sequence but with a different power level of the saturating pulse. In step 210, values indicating pH of the subject are generated using the data acquired in steps 206 and 208. In step 212, a report indicating pH is generated using values generated in step 210.

The system and method disclosed herein can be used to quantify in vivo CEST measurements from exchangeable sites including amide, amine, and hydroxyl groups so that both protein and microenvironmental changes in pathologies such as pH alteration from renal injury and acute stroke, and abnormal protein changes in tumor, Pompe disease, and multiple sclerosis can be shown. Also, pH MRI using the system and method as disclosed herein can be obtained following CT agents, no matter whether a single-site or multiple-site agent is chosen.

In CEST MRI, the dependence of CEST measurements on RF power can be described by two experimental factors: labeling coefficient that denotes the saturation efficiency of exchangeable protons, and the RF spillover factor that measures the concomitant direct RF saturation effect. Although the spillover factor can be estimated to correct experimentally-measured CEST effects, the estimation requires accurate $T_1$ and $T_2$ measurements, which can be challenging in the presence of CEST agents. Because the inverse CEST calculation corrects the RF spillover effect, pH can be determined independent of CEST agent concentration by taking the ratio of inverse CEST obtained under different RF power levels.

In detail, the steady state solution of CEST signal $I^{ss}$ can be described as:

$$\frac{I^{ss}}{I_0} = \frac{R_{1w}\cos^2\theta}{R_{1\rho}}, \tag{3}$$

where $I_0$ is the control MR signal where a saturating RF pulse is not applied, $R_{1w}$ is the intrinsic longitudinal relaxation rate of water protons, and $\theta = a\tan(\omega_1/\Delta\omega)$ with $\omega_1$ ($\omega_1 = 2\pi\gamma B_1$, where $B_1$ denotes RF irradiation power level) and $\Delta\omega$ as the RF irradiation amplitude and offset, respectively. In addition, $R_{1\rho}$ is the longitudinal relaxation rate in the rotating frame, $$R_{1\rho} = R_{1w}\cos^2\theta + \left(R_{2w} + \frac{f_r \cdot k_{sw} \cdot \alpha}{(\omega_1/\delta_s)^2 + (k_{sw}/\delta_s)^2}\right)\sin^2\theta, \tag{4}$$

where $f_r$, $k_{sw}$, and $\delta_s$ are the labile proton ratio with respect to bulk water protons, the exchange rate from solute to water, and the chemical shift between the solute proton and the water proton, respectively. In addition, $R_{2w}$ is the intrinsic transverse relaxation rate of water protons and $\alpha$ is the labeling coefficient $$\alpha = \frac{\omega_1^2}{p \cdot q \cdot (1 + (\Delta\omega - \delta_s)/p)^2 + \omega_1^2}, \text{ where } p = r_{2s} - \frac{k_{sw}k_{ws}}{r_{2w}},$$

$$q = r_{1s} = \frac{k_{sw}k_{ws}}{r_{1w}},$$

$k_{ws} = f_r \cdot k_{sw}$, $r_{1w} = R_{1w} + k_{ws}$, $r_{1s} = R_{1s} + k_{sw}$, $r_{2w} = R_{2w} + k_{ws}$, $r_{2w} = R_{2w} k_{ws}$ ($k_{ws}$ is the exchange rate from water protons to solute protons, and $r_{1w}$, $r_{1s}$, $r_{2w}$, $r_{2s}$ are effective longitudinal or transverse relaxation rates of water protons or solute protons, respectively).

The inverse CEST ($CESTR_{ind}$) is:

$$CESTR_{ind}(\omega_1) = \frac{I_0}{I_{label}} - \frac{I_0}{I_{ref}} = \frac{I_0}{I^{ss}(\delta\omega_s)} - \frac{I_0}{I^{ss}(-\delta\omega_s)}. \tag{5}$$

$$= \frac{\dfrac{f_r \cdot k_{sw} \cdot \alpha}{(\omega_1/\delta_s)^2 + (k_{sw}/\delta)^2}\sin^2\theta}{R_{1w}\cos^2\theta}$$

$$= \left(\frac{\dfrac{f_r \cdot k_{sw} \cdot \alpha}{(\omega_1/\delta_s)^2 + (k_{sw}/\delta)^2}}{R_{1w}}\right) \cdot \tan^2\theta$$

$$\approx \frac{f_r \cdot k_{sw}}{R_{1w}} \frac{\omega_1^2}{\omega_1^2 + k_{sw}(k_{sw} + R_{2s})}$$

So, RF-power based ratiometric of inverse CEST (PRICESTR) is:

$$PRICESTR(\omega_{11}, \omega_{12}) = \frac{CESTR_{ind}(\omega_{11})}{CESTR_{ind}(\omega_{12})} \quad (6)$$

$$= \frac{1 + k_{sw}(k_{sw} + R_{2s})/\omega_{12}^2}{1 + k_{sw}(k_{sw} + R_{2s})/\omega_{11}^2}.$$

Note, according to Eq. (6), PRICESTR does not depend on labile proton ratio $f_r$ and thus can be a concentration-independent index for exchange rates and pH values.

Further quantification of the underlying CEST system can be obtained by deriving the labile proton ratio and the exchange rate from PRICEST. Specifically, the labile proton exchange rates can be solved from Eq. (6) as:

$$k_{sw}(k_{sw} + R_{2s}) = \omega_{11}^2 \omega_{12}^2 \cdot \left( \frac{1 - PRICESTR}{\omega_{12}^2 \cdot PRICESTR - \omega_{11}^2} \right). \quad (7)$$

If the labile proton $T_{2s}(1/R_{2s})$ can be measured or estimated, the labile proton exchange rate can be solved as $$k_{sw} = \frac{\sqrt{R_{2s}^2 + 4\omega_{11}^2 \cdot \omega_{12}^2 \cdot \frac{1 - PRICESTR}{\omega_{12}^2 \cdot PRICESTR - \omega_{11}^2}} - R_{2s}}{2}. \quad (8)$$

The labile proton ratio can also be calculated from CEST measurement for a given RF power ($\omega_{11}$ or $\omega_{12}$)—provided that bulk water $T_{1w}$ ($1/R_{1w}$) can be independently determined—as:

$$f_r = \frac{R_{1w} \cdot (\omega_1^2 + k_{sw}(k_{sw} + R_{2s}))}{k_{sw} \cdot \omega_1^2} \cdot CESTR_{ind}(\omega_1). \quad (9)$$

A person skilled in the art would appreciate that any available pulse sequences and $T_1$, $T_2$, and $B_0$ estimation methods in the field can be used to estimate $T_1$, $T_2$ of water protons and $T_{2s}$. In one configuration, the $T_1$ map can be obtained by least-squares fitting of the signal intensities (I) as a function of inversion time ($I = I_0[1-(1+\eta)e^{-TI/T_1}]$), where $\eta$ is the inversion efficiency and $I_0$ is the equilibrium signal. The $T_2$ map can be derived by fitting the signal intensity as a function of the echo time, $I = I_0 e^{-TE/T_2}$. Field inhomogeneity $B_0$ map can be derived by fitting the phase map ($\varphi$) against the off-centered echo time ($\Delta\tau$) using $$\Delta B_0 = \frac{2\pi}{\gamma} \frac{\varphi}{\Delta\tau},$$

where $\gamma$ is the gyromagnetic ratio.

In one configuration, if a 3-point CEST pulse sequence is used, the CEST effect can be calculated using the standard CEST ratio as:

$$CESTR = (I_{ref} - I_{label})/I_0 \quad (10)$$

where $I_{ref}$ and $I_{label}$ are the reference and label scans, respectively, and $I_0$ is the control scan. In addition the inverse CEST can be calculated as:

$$CESTR_{ind} = \frac{I_0}{I_{label}} - \frac{I_0}{I_{ref}}. \quad (11)$$

Figure 3C:
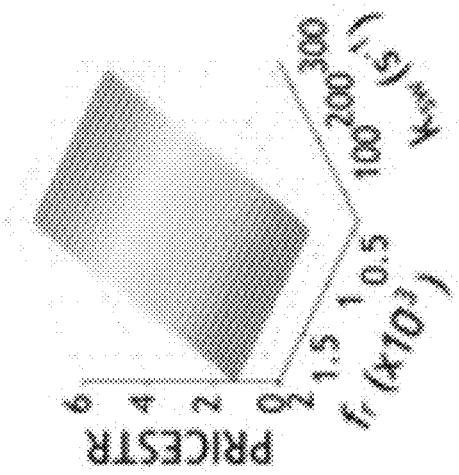
FIG. 3C shows that radio-frequency power based CESTRind (PRICESTR) increases with the exchange rate but exhibits little dependence on the labile proton ratio.
Figure 3B:
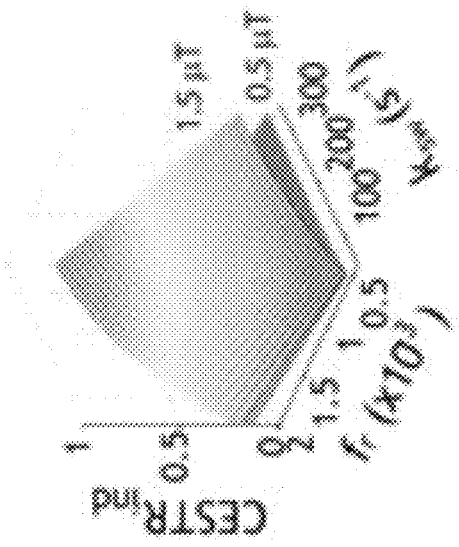
FIG. 3B shows inverse CESTR (CESTRind) as a function of labile proton ratios and exchange rates.
Figure 3A:
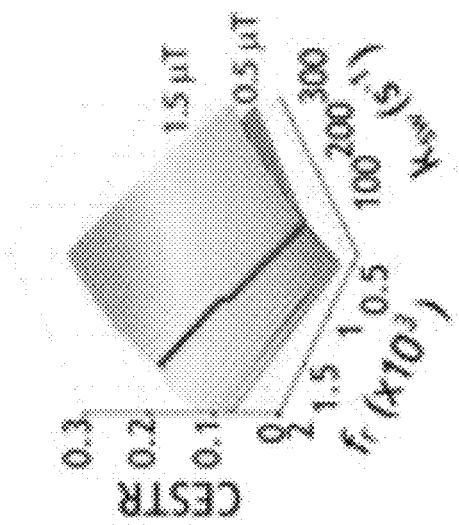
FIG. 3A shows a chemical exchange saturation transfer ratio (CESTR) as a function of labile proton ratios and exchange rates.

Referring to FIGS. 3A-3C, computer simulation demonstrating the relations of CESTR, CESTR$_{ind}$, and PRICESTR with the labile proton ratio ($f_r$) and the exchange rate ($k_{sw}$) are provided. A 2-pool model is used in the simulation. In the simulation, two RF power levels 0.5 and 1.5 µT are used, labile proton ratio and exchange rate respectively range from 1:2000 to 1:500 and from 50 to 250 s$^{-1}$, and bulk water $T_{1w}$, and $T_{2w}$ are 2s and 1s. FIG. 3A shows CESTR as a function of the labile proton ration and the exchange rate. Because creatine labile proton chemical shift is only 1.9 ppm away from that of bulk water resonance, it is susceptible to direct RF saturation (spillover) effect. Although the spillover effect is more severe at high RF power, RF saturation efficiency increases with power. So, for weak RF power, CESTR peaks at intermediate exchange rates; for high RF power levels, it continues to increase without peaking. In comparison, because inverse CESTR (CESTR$_{ind}$) suppresses RF spillover effects, it consistently increases with both labile proton ratio and exchange rate (FIG. 3B). FIG. 3C shows the PRICEST, which increases with labile proton exchange rates but has little dependence on the labile proton ratio, consistent with Eq. (6).

Referring to FIGS. 4a-9d, the results of measured CESTR, CESTR$_{ind}$, and PRCESTR of phantoms are provided. The RF power levels are systematically varied from 0.2 to 3 µT: from 0.2 to 1 µT with an increment step of 0.1 µT, followed by 1.25, 1.5, 1.75, 2, 2.5 and 3 µT. Two kinds of phantoms—a pH phantom and a concentration phantom—can be prepared with creatine and phosphate buffer solution. The phantoms comprise multiple tubes, each filled with the creatine solution. For the pH phantom, pH of the tubes can be titrated to a range of values with the creatine concentration fixed. E.g., the range of the pHs is 5.99, 6.48, 6.75, 7.02 and 7.24, and the concentration is 60 mM. For the concentration phantom, the creatine concentration of each tube varies with the pH fixed. E.g., the concentration ranges from 100, 80, 60, 40 to 20 mM, and their pH is titrated as 6.75. The tubes are inserted into phantom containers filled with a solution, e.g., 1% low gelling point agarose to fixate the tubes.

FIGS. 4a-4f shows the CESTR, CESTR$_{ind}$, and PRICEST of a pH phantom that contains multiple vials of the same creatine concentration titrated to pH values from 5.99 to 7.24. FIGS. 4a and 4b show CESTR for saturating RF powers at 0.5 and 1.25 µT. CESTR appears slightly hyperintense for intermediate pH values under 0.5 µT, while CESTR for higher-pH vials substantially increases at 1.25 µT. This is because a weak RF power of 0.5 µT is inefficient to saturate labile protons at higher pH values, resulting in attenuated CESTR at those higher pH values. The labeling coefficient substantially increases for $B_1$ of 1.25 µT, resulting in stronger CESTR effect at higher pH (FIG. 4b). FIGS. 4c and 4d show the CESTR$_{ind}$ for saturating RF powers of 0.5 and 1.25 µT, respectively. For $B_1$ of 0.5 µT, the RF spillover factor is relatively minor, CESTR$_{ind}$ is approximately equal to CESTR. For $B_1$ of 1.25 µT, CESTR$_{ind}$ is substantially higher than CESTR because inverse CEST corrects RF spillover effect, which is no longer negligible at $B_1 = 1.25$ µT. FIG. 4e shows the contrast to noise ratio (CNR) for PRICEST between signals from vials with pH of 6.99 and 7.24 as a function of RF power levels. For the pH phantom, CNR peaks when the ratio of CESTR$_{ind}$ is acquired with a pair of a moderately-weak (~0.5 µT) and an intermediate RF power (~1.25 µT) level. FIG. 4f shows PRICEST map calculated from CEST measurements using $B_1$ of 0.5 and 1.25 µT, showing consistent increase of PRICEST with pH.

FIGS. 5a-5f show the CESTR, CESTRind, and PRICEST of a concentration phantom that contains multiple vials of creatine concentration varied from 20 to 100 mM but titrated to the same pH. FIGS. 5a and 5b show CESTR for saturating RF powers at 0.5 and 1.25 µT. CESTR appears relatively hyperintense for the highest concentration vial, and CESTR increases substantially when RF power is increased from 0.5 to 1.25 µT. This is because all vials are titrated to the same pH, resulting in the same exchange rate and thus labeling coefficient. Consequently, CESTR increases with labile proton ratios. FIGS. 5c and 5d show the inverse CESTR for RF powers of 0.5 and 1.25 µT, respectively. For $B_1$ of 0.5 µT, $CESTR_{ind}$ is slightly higher than CESTR and for $B_1$ of 1.25 µT, $CESTR_{ind}$ is substantially higher than CESTR. This is because inverse CEST corrects RF spillover effect, which is more severe under $B_1$ of 1.25 µT than 0.5 µT. FIG. 5e evaluates the CNR for PRICEST between 20 and 100 mM creatine vials, which shows little dependence with RF power levels. This indicates that there is little creatine concentration induced difference in PRICESTR. Indeed, using the optimal RF power levels determined from pH phantom (FIG. 4e), PRICEST map (FIG. 5f) shows little change between vials of different CEST agent concentration, as predicted in Eq. (6).

Figures 6A, 6B:
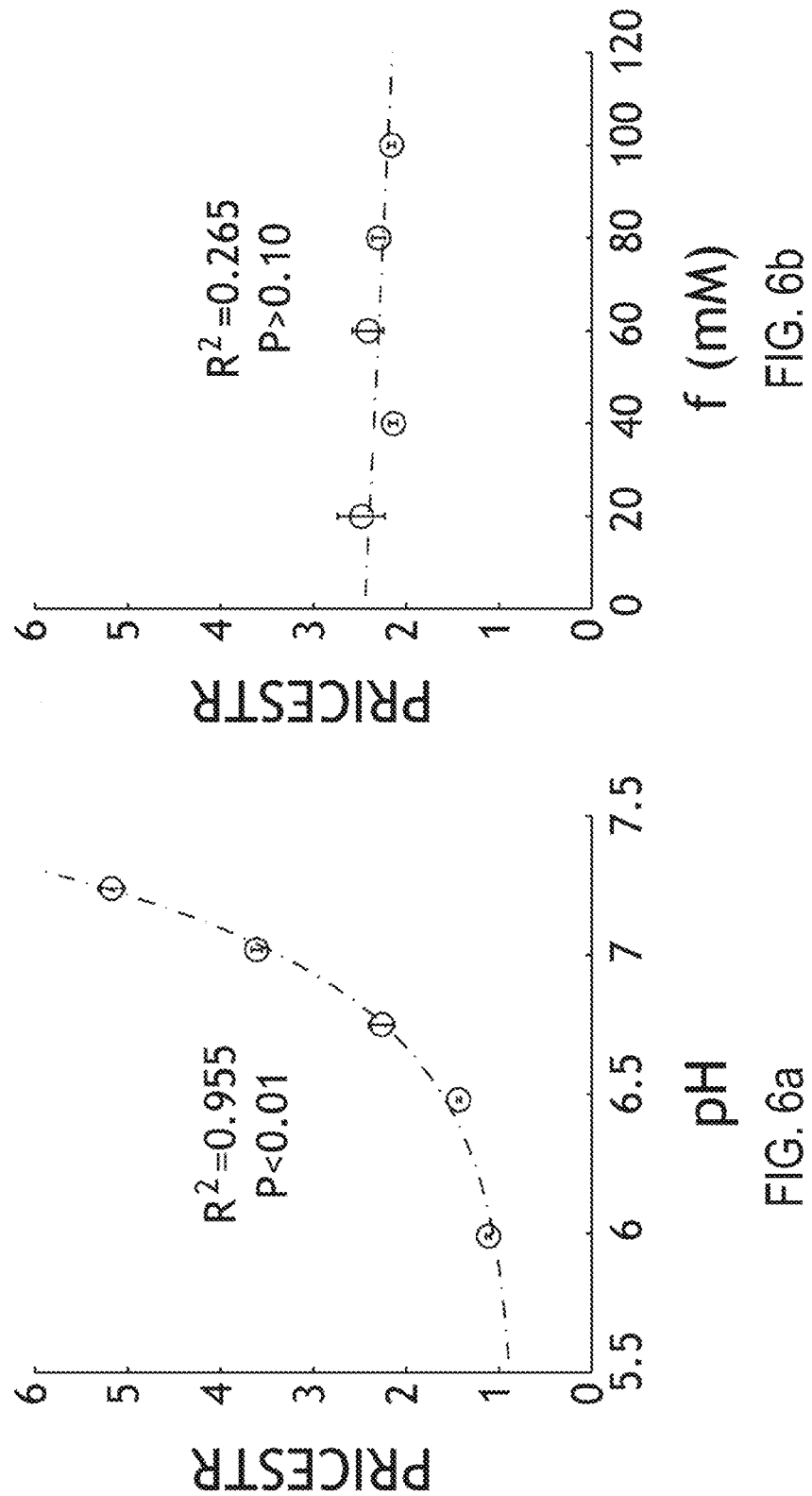
FIG. 6a shows PRICEST measurements as a function of pH.
FIG. 6b shows PRICESTR as a function of creatine concentration.

FIGS. 6a and 6b show PRICEST as a function of pH and creatine concentration. Specifically, FIG. 6a shows that PRICESTR increases consistently with pH, following a base-catalyzed relation as $PRICESTR=0.81+0.96 \cdot 0.10^{pH-5.57}$ (dash dotted line). The base-catalyzed fitting is in good agreement with PRICESTR measurement ($R^2=0.955$, $P<0.01$, Pearson Correlation). In addition, PRICEST shows little change with creatine concentration as $PRICESTR=-0.002*f+2.4$, where f is creatine concentration in mM (FIG. 6b). No significant correlation between PRICESTR and creatine concentration is found ($R^2=0.265$, $P>0.10$, Pearson Correlation). The data confirms Eq. (6) that PRICESTR increases with exchange rate and thus pH while it does not change significantly with CEST agent concentration.

Figure 7A:
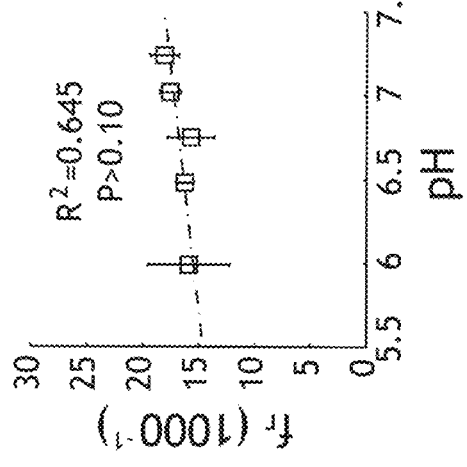
FIG. 7a shows the labile exchange rates ($k_{sw}$) derived from PRICEST measurements as a function of pH.
Figure 7B:
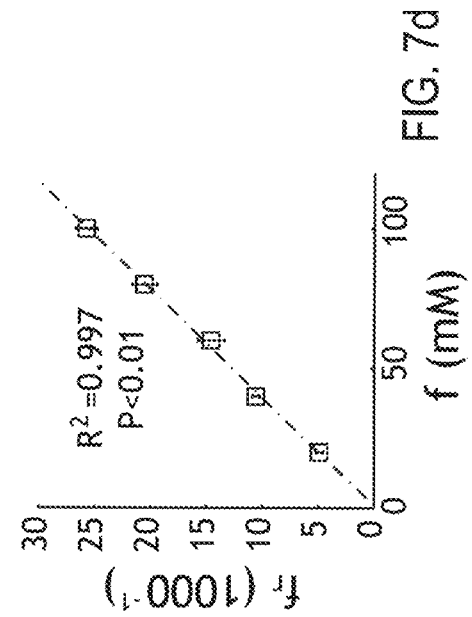
FIG. 7b shows labile proton ratios ($f_r$) derived from PRICEST measurements as a function of pH.
Figure 7C:
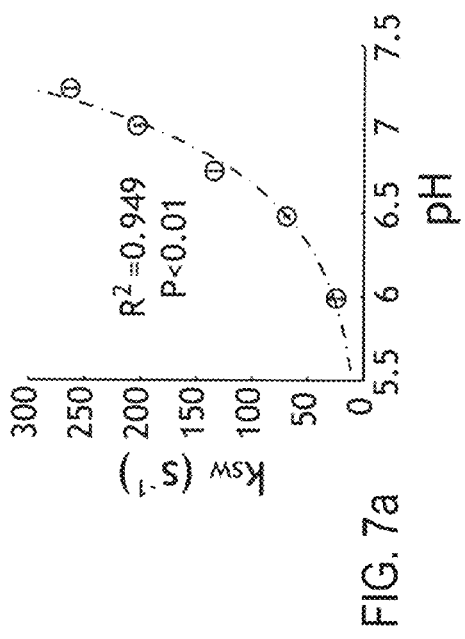
FIG. 7c shows $k_{sw}$ derived from PRICEST measurements as a function of creatine concentration.
Figure 7D:
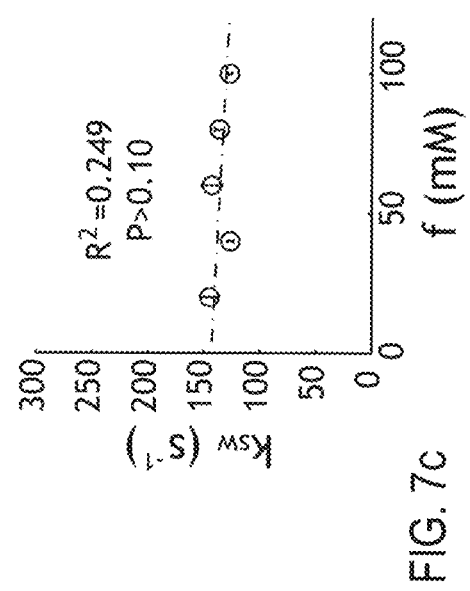
FIG. 7d shows $f_r$ derived from PRICEST measurements as a function of creatine concentration.
Figure 9A:
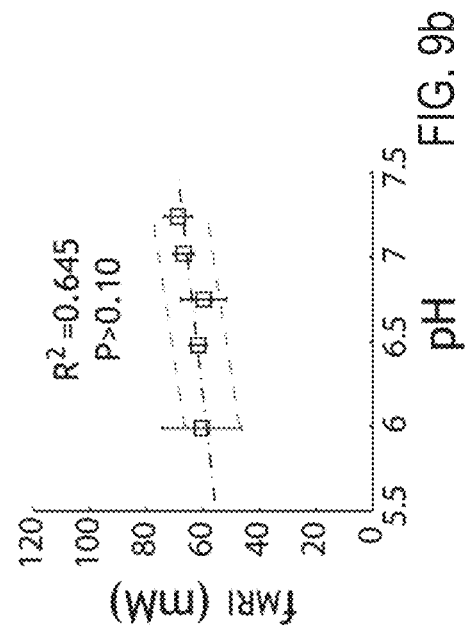
FIG. 9a shows a plot of $pH_{MRI}$ vs. titrated pH of the pH phantom.
Figure 9B:
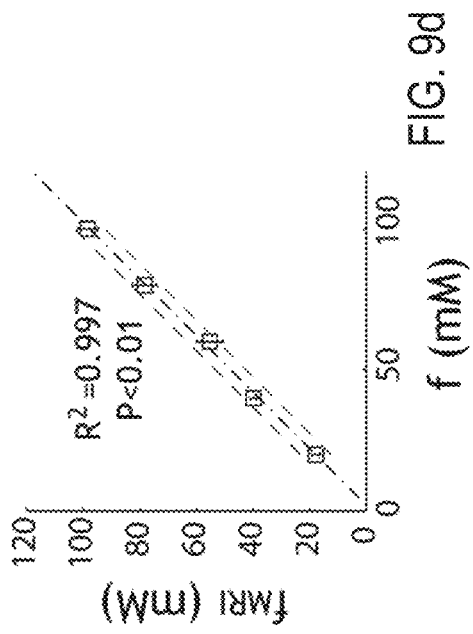
FIG. 9b shows a plot of $f_{MRI}$ vs. titrated pH of the pH phantom.
Figure 9C:
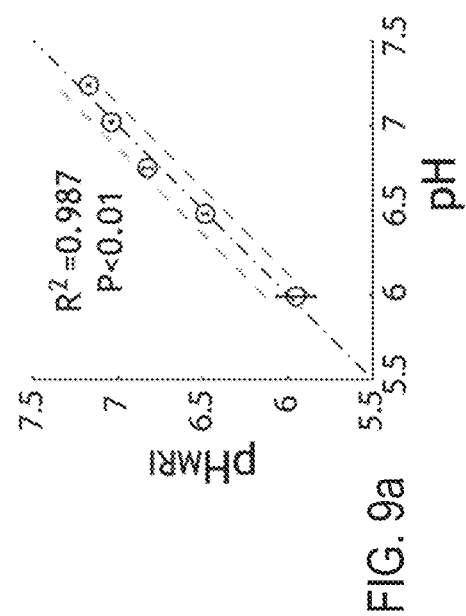
FIG. 9c shows $pH_{MRI}$ vs. creatine concentration of the concentration phantom.
Figure 9D:
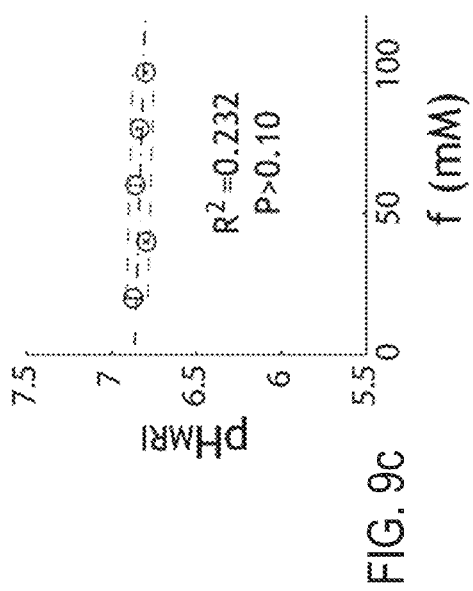
FIG. 9d shows $f_{MRI}$ vs. creatine concentration of the concentration phantom.

FIGS. 7a-7d show the labile proton ratio and exchange rate can be determined from PRICEST (Eqs. (8) and (9)). With extrapolation, the $T_1$ relaxation time of water protons is estimated to be $T_{1w}=3.0$ s and the $T_2$ relaxation time of an amine proton is estimated to be $T_{2s}=20$ ms. For the pH phantom, the labile proton exchange rate and ratio in relation with pH are shown in FIGS. 7a and 7b, respectively. The exchange rate increases with pH, which can be described by an exponential relation. The fitted equation is $k_{sw}(s^{-1})=10^{0.85*pH-3.65}$ ($R^2=0.949$ and $P<0.01$). Based on the solved exchange rate, the labile proton ratio can be determined following Eq. (9). The labile proton ratio is found to be $f_r=0.002*pH+0.005$ ($R^2=0.645$ and $P>0.10$). In addition, for the concentration phantom, its exchange rate changes little with creatine concentration (FIG. 7c), with $k_{sw}(s^{-1})=143-0.13*f$, where f is creatine concentration in mM ($R^2=0.221$ and $P>0.10$). The labile proton ratio shows strong linear relation with creatine concentration as $f_s=0.258\times10^{-3}*f-0.241\times10^{-3}$ ($R^2=0.997$ and $P<0.01$).

Therefore, both pH and creatine concentration maps can be derived from PRICESTR. FIG. 8a shows that pH determined from MRI ($pH_{MRI}$) increases with titrated pH while creatine concentration estimated from MRI ($f_{MRI}$) varied little with pH (FIG. 8b). For the concentration phantom, $pH_{MRI}$ map (FIG. 8c) shows little change while the $f_{MRI}$ map (FIG. 8d) scales linearly with creatine concentration.

FIGS. 9a-9d show that $pH_{MRI}$ and $f_{MRI}$ correlate well with titrated pH and creatine concentration. Specifically, for pH phantom, regression analysis shows $pH_{MRI}$ linearly increases with titrated pH as $pH_{MRI}=pH$ ($R^2=0.987$, $P<0.01$) while $f_{MRI}$ shows little dependence on pH as $f_{MRI}=6.79*pH+18$ mM ($R^2=0.645$, $P>0.10$). In addition, for the creatine concentration phantom, regression analysis shows $pH_{MRI}$ varies little with creatine concentration as $pH_{MRI}=-0.0005*f+6.86$ ($R^2=0.232$, $P>0.10$) while $f_{MRI}$ linearly increases with creatine concentration as $f_{MRI}=f-1.860$ mM ($R^2=0.997$, $P<0.01$). $pH_{MRI}$ and $f_{MRI}$ determined from two separate phantoms are in good agreement. $pH_{MRI}$ for the vial of pH at 6.75 in the pH phantom is found to be 6.83, within 95% confidence level of $pH_{MRI}$ calculated from different vials of the concentration phantom (same pH) as from 6.75 to 6.90. In addition, $f_{MRI}$ for concentration phantom of 60 mM is found to be 55.5 mM, within 95% confidence level of $f_{MRI}$ calculated from different vials of the pH phantom as from 54.2 to 73.5 mM.

Sensitivity and accuracy in characterizing CEST features (i.e. solving both labile proton ratios and exchange rates) depends on signal to noise ratio (SNR). For example, much higher standard deviation occurs in determined labile proton ratios of the lower pH. This is because the exchange rate at lower pH is substantially lower than that of higher pH, resulting in reduced CEST effect and thus sensitivity. The accuracy of CEST MRI measurements can be improved by improving the SNR as the SNR can be improved with experiment optimization, use of more sensitive hardware (coils and electronics), innovative pulse sequences, and signal averaging.

Any two different RF power levels can be used for PRICEST imaging. The optimal choice of RF power levels may be determined for a given study, which may depend on labile proton exchange rates, chemical shifts and magnetic field strength. The accuracy of the CEST measurements by PRICEST can be improved by improving the accuracy of the RF power level and $T_{1w}$ measurement with standard pre-scan calibration and relaxation experiments. PRICESTR is sensitive to exchange rates and pH, not CEST agent concentrations. If a curve, such as pH vs. PRICESTR, can be determined, pH can be determined based on the curve without additional derivation. Thus, the systems and methods as disclosed herein, such as using PRICESTR, simplifies pH imaging.

The PRICEST approach is simple to apply yet provides concentration—independent pH determination, as it only needs CEST measurements under two RF power levels with minimal a priori information. In comparison, in the presence of unknown CEST agent concentration and pH, the specificity of prior attempted methods may be limited. Although a RF power (RFP)-CEST analysis can separate labile proton ratios from exchange rates, that method requires multi-parameter non-linear fitting and thus is difficult to apply routinely.

If concomitant RF spillover effects are negligible, the PRICSET is approximately equivalent to the ratio of conventional CESTRs.

Concomitant RF irradiation effects can be removed. For example, in renal pH imaging, concomitant RF irradiation effects can be removed by monitoring the dynamic course of CEST MRI following contrast administration because the change from baseline is dominated by CEST effects caused by the administered contrast agent. When endogenous CEST contrast is used, Lorentzian line-based or model-based approach can be used to decouple endogenous CEST effects from concomitant RF irradiation effects to improve characterization of the pathological changes.

The PRICESTR method is insensitive to RF spillover effects. Omega plot analysis can provide concentration-independent measurement of exchange rate in paramagnetic CEST agent. Because the chemical shift for diamagnetic CEST (DIACEST) agents is relatively close to the bulk water resonance, DIACEST MRI is more susceptible to RF spillover effect than PARACEST imaging. Conventional omega plot approaches cannot distinguish RF spillover effect from CEST effects. As a result, labile proton ratios and exchange rates can be grossly overestimated with those approaches. With RF spillover effect corrected, omega plot analysis can be extended to DIACEST MRI analysis. But such an extension requires estimation of labile proton ratios and exchange rates, which can be cumbersome. In comparison, the inverse CEST is immune from RF spillover effects and thus the PRICEST approach is accurate in the presence of substantial $T_{2w}$ changes that may occur following contrast agent injection or pathological changes.

In the case of small RF spillover effects, the PRICSETR is approximately equivalent to the ratio of conventional CESTRs. Because both labeling coefficient and spillover factor depend on RF power level, RF power-based ratiometric of CEST ratio (rCESTR) can remove effects from relaxation and labile proton concentration, permitting pH measurement. The measurement also is concentration—independent, alleviating stringent requirements of conventional ratiometric CEST imaging on CEST agent properties. The rCESTR approach is similar to the PRICESTR approach, particularly when direct RF saturation effects are not substantial.

CEST effect can be measured by taking the difference of reference ($I_{ref}$) and label scans ($I_{label}$), normalized by the control scans ($I_0$) as:

$$\text{CESTR} = (I_{ref} - I_{label})/I_0 \tag{12}$$

The CEST effect in relation with labeling coefficient ($\alpha$) and spillover factor ($1-\sigma$) can be empirically described as:

$$CESTR = \frac{f_r \cdot k_{sw}}{R_{1w} + f_r \cdot k_{sw}} \cdot \alpha \cdot (1-\sigma) \text{ where } \frac{f_r \cdot k_{sw}}{R_{1w} + f_r \cdot k_{sw}}, \tag{13}$$

is the simplistic CEST effect, $k_{sw}$ is the chemical exchange rate from labile protons to bulk water, $f_r$ is labile proton fraction ratio, and $R_{1w}$ is bulk water longitudinal relaxation rate. In Eq. (13), $$\alpha = \frac{\omega_1^2}{p \cdot q + w_1^2}.$$

The spillover factor is equal to:

$$1 - \frac{r_{1w}}{k_{ws}} \left( \frac{R_{1w}r_{2s}\cos^2\theta + R_{1s}k_{ws}\cos\theta\cos^2\left(\frac{\theta}{2}\right)}{r_{zw}r_{zs} - k_{ws}k_{sw}\cos^2\left(\frac{\theta}{2}\right)} - \frac{R_{1w}r_{2s}\cos^2\theta}{r_{zw}r_{2s} - k_{ws}k_{sw}\sin^2(\theta)} \right),$$

where, $r_{zw}=r_{1w}\cos^2\theta/2+r_{2w}\sin^2\theta/2$, $r_{zs}=r_{1s}\cos^2\theta+r_{2s}\sin^2\theta$, $\theta=\tan^{-1}(w_1/\Delta w_s)$, and $\Delta w_s$ is the labile proton chemical shift.

rCESTR is the ratio of CEST effects under two RF power levels:

$$rCESTR = \frac{\frac{f_r \cdot k_{sw}}{R_{1w} + f_r \cdot k_{sw}}}{\frac{f_r \cdot k_{sw}}{R_{1w} + f_r \cdot k_{sw}}} \cdot \frac{\alpha \cdot (1-\sigma)|_{w_{1a}}}{\alpha \cdot (1-\sigma)|_{w_{1b}}}, \tag{14}$$

where $\omega_{1a}$ and $\omega_{1b}$ are two different RF power levels. This ratio rCESTR is sensitive to the exchange rate, not the labile proton ratio. For dilute CEST agents with typical relaxation rates, $p \approx R_{2s}+k_{sw}$ and $q \approx k_{sw}$. As a result, rCESTR can be approximated as:

$$rCESTER \approx \frac{\frac{w_{1a}^2}{k_{sw}(R_{2s}+k_{sw})+w_{1a}^2}}{\frac{w_{1b}^2}{k_{sw}(R_{2s}+k_{sw})+w_{1b}^2}} \cdot \frac{(1-\sigma)|_{w_{1a}}}{(1-\sigma)|_{w_{1b}}}. \tag{15}$$

Based on Equation (15), the exchange rate $k_{sw}$ can be derived as:

$$k_{sw} = \frac{\sqrt{R_{2s}^2 + 4\left(\frac{w_{1b}^2 - w_{1a}^2}{\left(\frac{(1-\sigma)|_{w_{1b}}}{(1-\sigma)|_{w_{1a}}}\right) \cdot \frac{w_{1b}^2}{w_{1a}^2} \cdot} - w_{1a}^2\right)} - R_{2s}}{2}. \tag{16}$$

A person skilled in the art would appreciate that any available pulse sequences and $T_1$, $T_2$, and $B_0$ estimation methods in the field can be used to estimate $T_1$, $T_2$ of water protons and $T_{2s}$. Unlike PRICESTR, the spillover factor can be estimated based on $B_1$, $T_1$, $T_2$, field strength and chemical shift in quantification of rCESTR. Furthermore, decoupling multiple resonances using fitting routines (e.g. Lorentzian- or model-based) can further enhance the precision of the calculation.

The SNR of rCESTR can be derived based on error propagation theory as:

$$SNR_{rCESTR} = \frac{SNR_{CESTR}(\omega_{1a}) \cdot SNR_{CESTR}(\omega_{1b})}{\sqrt{SNR_{CESTR(\omega_{1a})}^2 \cdot SNR_{CESTR(\omega_{1b})}^2}}. \tag{17}$$

The SNRs of CENTR at each power level can be approximated by the SNR of the control image—an image acquired without saturation irradiation—as:

$$SNR_{CESTR} \approx \frac{CESTR}{\sqrt{2+CESTR^2}} \cdot SNR_{I_0}, \tag{18}$$

where $SNR_{I_0}$ is the SNR of the control image.

The CNR of rCESTR can be shown to be:

$$CNR \approx \frac{\left.\frac{CESTR(\omega_{1a})}{CESTR(\omega_{1b})}\right|_{pHa} - \left.\frac{CESTR(\omega_{1a})}{CESTR(\omega_{1b})}\right|_{pHb}}{\sqrt{\left\|\left(\frac{CESTR^2(\omega_{1a})}{CESTR^2(\omega_{1b})}\right)\left(\frac{2}{CESTR^2(\omega_{1a})} + \frac{2}{CESTR^2(\omega_{1b})}\right)\right\|_{pHa} + \left\|\frac{CESTR^2(\omega_{1a})}{CESTR^2(\omega_{1b})}\left(\frac{2}{CESTR^2(\omega_{1a})} + \frac{2}{CESTR^2(\omega_{1b})}\right)\right\|_{pHb}} \cdot \frac{1}{SNR_{I_0}^2}} \quad (19)$$

$$= \frac{\left(\left.\frac{CESTR(\omega_{1a})}{CESTR(\omega_{1b})}\right|_{pHa} - \left.\frac{CESTR(\omega_{1a})}{CESTR(\omega_{1b})}\right|_{pHb}\right) \cdot \frac{SNR_{I_0}}{\sqrt{2}}}{\sqrt{\left\|\left(\frac{1}{CESTR^2(\omega_{1b})} + \frac{CESTR^2(\omega_{1a})}{CESTR^4(\omega_{1b})}\right)\right\|_{pHa} + \left\|\left(\frac{1}{CESTR^2(\omega_{1b})} + \frac{CESTR^2(\omega_{1a})}{CESTR^4(\omega_{1b})}\right)\right\|_{pHb}}}$$

$$= \frac{(rCESTR|_{pHa} - rCESTR|_{pHb})}{\sqrt{\left.\frac{(1 + rCESTR^2)}{CESTR^2(\omega_{1b})}\right|_{pHa} + \left.\frac{(1 + rCESTR^2)}{CESTR^2(\omega_{1b})}\right|_{pHb}}} \cdot \frac{SNR_{I_0}}{\sqrt{2}}.$$

Referring to FIGS. 10a-10d, plots of simulated CESTR, rCESTR contrast (ΔrCESTR), relative contrast to noise ratio $$\left(rCNR = \frac{CNR}{SNR_{I_0}}\right),$$

and rCESTR using a 2-pool model are provided. In the simulation, $T_{1w}$, and $T_{2w}$ of water are 2 s and 100 ms, $T_{1s}$ and $T_{2s}$ of the solute are 1 s and 20 ms, and the labile proton chemical shift is 1.9 ppm at 4.7 T. The exchange rate varies from 50 to 300 s$^{-1}$, corresponding to amine proton exchange rates of creatine at pH between 6.0 and 7.2. Also, RF power levels of saturation irradiation pulses vary from 0 to 3 μT in FIGS. 10a-10c.

FIG. 10a shows conventional CEST asymmetry calculation as a function of RF power level for two exchange rates of 50 and 300 s$^{-1}$. CESTR initially increases with RF power levels due to more efficient RF saturation at the creased RF power levels, then peaks and decreases at higher RF power levels because of concomitant direct RF saturation of bulk water—the spillover effect. FIG. 10b shows rCESTR contrast between two exchange rates of 50 and 300 s$^{-1}$, under varied B1 levels (shown as $B_{1a}$ and $B_{1b}$). The Logarithm of ΔrCESTR is plotted due to the large range of ΔrCESTR. Because CESTR is small under weak irradiation levels, ΔrCESTR peaks when the ratio of CESTR is of a weak and a strong $B_1$. Relative CNR $$\left(rCNR = \frac{CNR}{SNR_{I_0}}\right)$$

is considered when optimizing rCESTR. FIG. 10c shows that simulated rCNR plateaus under moderate B1 levels ($B_{1a}$ around 0.5-1 μT and $B_{1b}$ around 1.5-2.5 μT). FIG. 10d shows simulated rCESTR for a range of labile proton concentrations and exchange rates at two $B_1$s of 0.75 and 2 μT. rCESTR depends on exchange rates but changes little with labile proton ratios, demonstrating that rCESTR is sensitive to exchange rates but independent of CEST agent concentration.

Referring to FIGS. 11a-14d, the results of measured CESTR and rCESTR of phantoms are provided. The RF power level varies from 0.2 to 3 μT: from 0.2 to 1 μT with an increment step of 0.1 μT, followed by 1.25, 1.5, 1.75, 2, 2.5 and 3 μT. The actual $B_1$ field experienced at a given image slice can be calibrated by varying the saturation flip angle (θ) from 10° to 180°, with intervals of 10°. Two kinds of phantoms—a pH phantom and a concentration phantom—can be prepared with creatine and phosphate buffer solution. The phantoms comprise multiple tubes, each filled with the creatine solution. For the pH phantom, pH of the tubes can be titrated to a range of values with the creatine concentration fixed. E.g., the range of the pHs is 5.99, 6.48, 6.75, 7.02 and 7.24, and the concentration is 60 mM. For the concentration phantom, the creatine concentration of each tube varies with the pH fixed. E.g., the concentration ranges from 100, 80, 60, 40 to 20 mM, and their pH is titrated as 6.75. The tubes are inserted into phantom containers filled with a solution, e.g., 1% low gelling point agarose to fixate the tubes.

FIGS. 11a-11d show the rCESTR of a pH phantom. FIGS. 11a and 11b show CESTR maps obtained under RF power levels of 0.5 and 2.3 μT. CESTR appears slightly hyperintense for intermediate pH values under 0.5 μT while CESTR for higher pH vials substantially increases with the RF power level at 2.3 μT. This is because a weak RF power of 0.5 μT is inefficient to saturate relatively fast exchangeable protons with high pH, which leads to a small labeling coefficient. The saturation efficiency increases for $B_1$ of 2.3 μT, resulting in stronger CEST effects at high pH values (FIG. 11b). FIG. 11c shows the CNR between signals from vials with pH of 5.99 and of 7.24 as a function of RF power levels. CNR peaks when rCESTR is the ratio of CESTRs at an intermediate RF power level (~2.3 μT) over a moderately-weak RF power level (~0.5 μT). FIG. 11d shows rCESTR map obtained under optimal B1 levels corresponding to peak CNRs for the pH phantom, showing consistent increase with pH.

FIGS. 12a-12d show the rCESTR of a concentration phantom. FIGS. 12a and 12b show CESTR maps with RF powers at 0.5 and 2.3 μT. CESTR appears relatively hyperintense for the vial of the highest creatine concentration, and CESTR increases substantially when RF power is increased from 0.5 to 2.3 μT. Because all vials in the phantom are titrated to the same pH, the exchange rates and thus labeling coefficients are similar. So, according to Eq. (13), the CESTR increases with labile proton concentration. But rCESTR normalizes the confounding factor from CEST agent concentrations and changes little with various concentrations. This explains the little contrast between different vials shown in FIG. 12c, where the plot of CNR between signals from the 20 and the 100 mM creatine vials is provided. Using the optimal RF power levels determined from pH phantom, rCESTR map (FIG. 12d) shows little change with creatine concentrations.

Figure 13A:
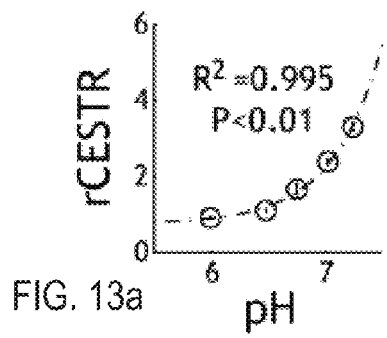
FIG. 13a shows rCESTR as a function of pH.

FIGS. 13a-13f show rCESTR as a function of pH and creatine concentrations. FIG. 13a shows that rCESTR increases with pH, following a base-catalyzed relation fitted as rCESTR=0.76+0.87·10$^{PH-6.76}$ (dash-dotted line). The base-catalyzed fitting is in good agreement (P<0.01, Pearson Correlation) with rCESTR measurements, suggesting a dominant base-catalyzed amine proton exchange rate. In comparison, rCESTR shows little change with creatine concentration, with the fitted relation as rCESTR=−0.007*

Figure 13B:
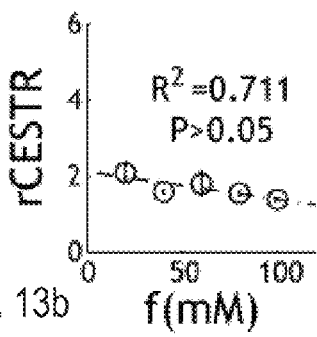
FIG. 13b shows rCESTR as a function of creatine concentration.
Figure 13C:
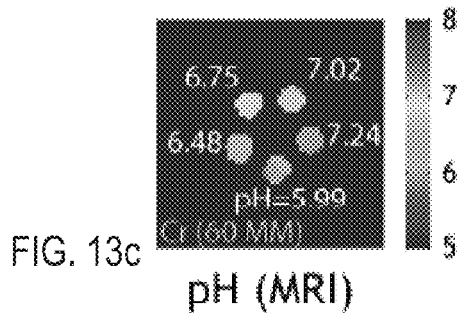
FIG. 13c shows the pH map determined from the rCESTR map of the pH phantom.
Figure 13D:
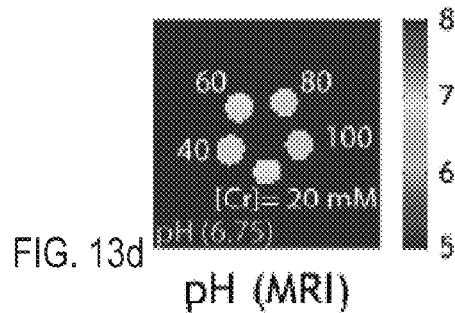
FIG. 13d shows the pH map determined from the rCESTR map of the concentration phantom.
Figure 13E:
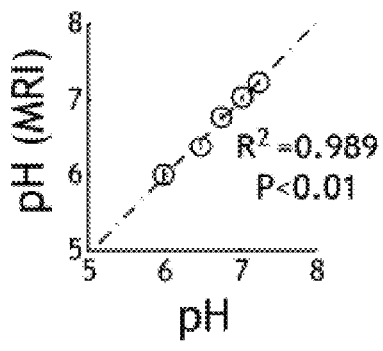
FIG. 13e shows regression analysis between pH determined from rCESTR ($pH_{MRI}$) and titrated pH for the pH phantom.
Figure 13F:
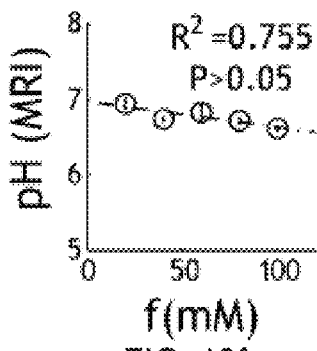
FIG. 13f shows regression analysis between $pH_{MRI}$ and creatine concentration for the creatine concentration phantom.

[Cr]+2.13 ([Cr] is creatine concentration in mM) (FIG. 13b). No significant correlation between rCESTR and creatine concentration is found (P>0.05). Using the relation between rCESTR and pH determined from FIG. 13a, pH maps are derived for a pH (FIG. 13c) and a concentration phantom (FIG. 13d). FIG. 13e shows pH derived from rCESTR strongly (P<0.01) correlates with pH but insignificantly (P>0.05) correlates with creatine concentrations (FIG. 13f). The measured pH for the pH phantom is within 0.11 pH unit from titrated pH values; for the creatine concentration phantom, the accuracy of the measured pH is within 0.20 pH unit.

FIGS. 14a-14d show exchange rates derived from rCESTR MRI. FIG. 14a shows that exchange rates determined from Eq. (16) for the pH phantom increases with pH, consistent with the fact that creatine amine proton chemical exchange is dominantly base-catalyzed. FIG. 14b shows the exchange rate as a function of pH with a fitted function of $k_{sw}=54+1.16 \cdot 10^{pH-4.98}$ ($R^2=0.964$, P<0.01). In comparison, exchange rates determined from the concentration phantom change little with creatine concentrations (FIG. 14c). FIG. 14d shows that correlation between exchange rates and creatine concentrations is not statistically significant (P>0.05). The exchange rate is 140 $s^{-1}$ measured with rCESTR from the vial with pH of 6.75 at 60 mM, in good agreement with the exchange rate of 142±22 $s^{-1}$ determined from the concentration phantom with creatine concentrations varied from 20 to 100 mM (pH=6.75).

The RF spillover factor depends on RF power and relaxation rates, with little dependence on labile proton ratios and exchange rates. Taking the ratio of spillover factors under different RF power levels further reduces its sensitivity to relaxation times, which allows reliable pH determination.

Figure 15A:
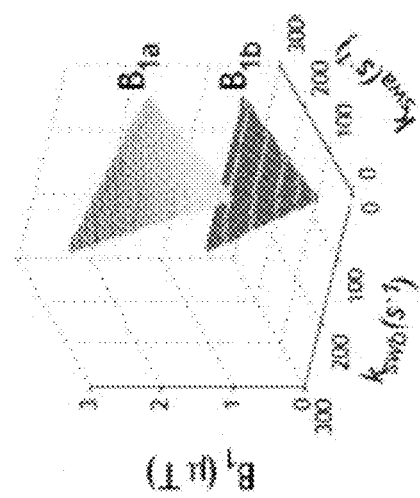
FIG. 15a shows numerically-derived peak rCNR of rCESTR for exchange rates from 50 to 300 $s^{-1}$ with $T_{1w}$=2s, $T_{2w}$=100 ms, and chemical shift δ=2 ppm at 4.7 Tesla.
Figure 15B:
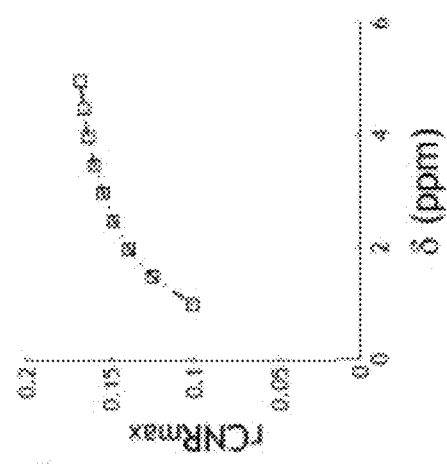
FIG. 15b shows simulated optimal $B_1$ levels for peak rCNR.
Figure 15C:
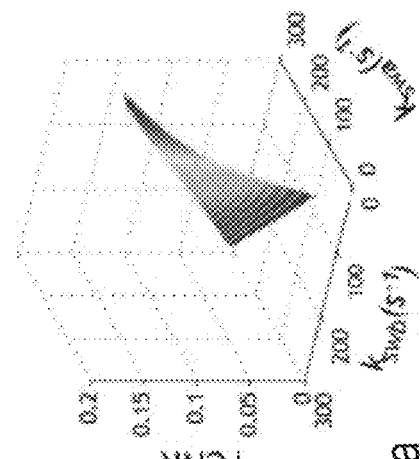
FIG. 15c shows the optimal B1 levels for peak rCNR normalized by B1 levels independently optimized for each exchange rate.
Figure 15D:
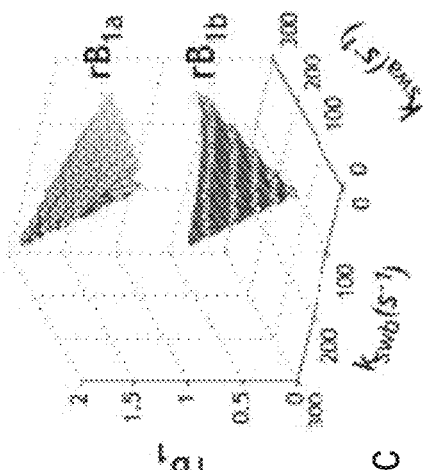
FIG. 15d shows peak rCNR as a function of chemical shifts.

Any two different RF power levels can be used for rCESTR imaging, but RF power levels can be chosen by maximizing the SNR, CNR, or both. To demonstrate this, rCESTR MRI is simulated for exchange rates from 50 to 300 $s^{-1}$ at 4.7 T, with $T_{1w}$ and $T_{2w}$ of 2 s and 100 ms, respectively. FIG. 15a shows that the rCNR for labile protons at a chemical shift of 2 ppm increases with the difference of the two exchange rates. FIG. 15b shows the numerically-derived optimal B1 levels ($B_{1a}$ and $B_{1b}$ with $B_{1a}<B_{1b}$) under which rCNR is at the peak for a pair of exchange rates. $B_{1a}$ consistently increases with exchange rates while $B_{1b}$ remained relatively constant. This means that optimal $B_{1b}$ levels can be derived independently from the $B_{1a}$ levels. FIG. 15c shows numerically-simulated optimal $B_1$ levels for peak rCNR normalized by optimal $B_1$ levels optimized independently for each exchange rate, both of which deviate substantially from unity. So choosing optimal $B_1$ levels to maximize SNR or CNR of rCESTR is different from conventional CEST MRI optimization. FIG. 15d shows that the peak rCNR increases with chemical shifts because RF spillover effects decrease with chemical shifts.

Figure 16A:
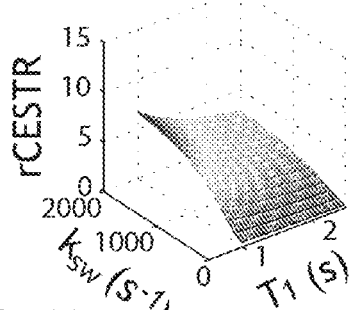
FIG. 16a shows rCESTR as a function of exchange rates and $T_1$.
Figure 16B:
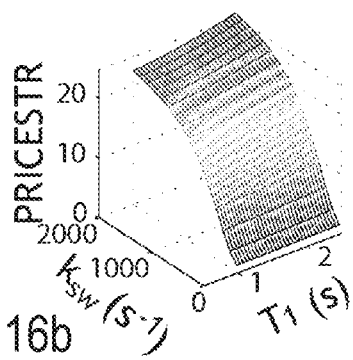
FIG. 16b shows PRICESTR as a function of exchange rates and T1.
Figure 16C:
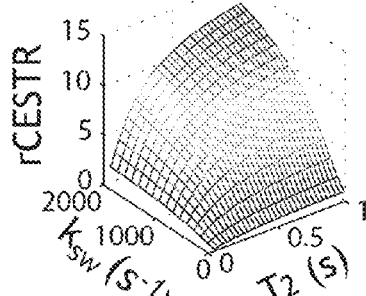
FIG. 16c shows rCESTR as a function of exchange rates and T2.
Figure 16D:
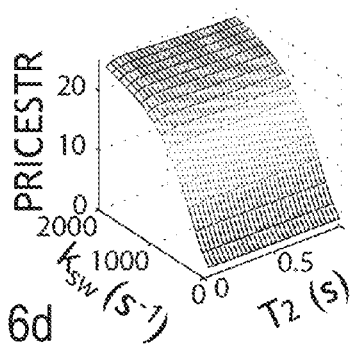
FIG. 16d shows PRICESTR as a function of exchange rates and T2.
Figure 16E:
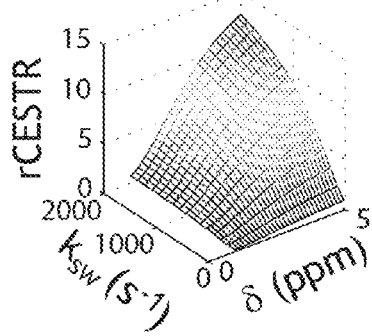
FIG. 16e shows rCESTR as a function of exchange rates and chemical shifts.
Figure 16F:
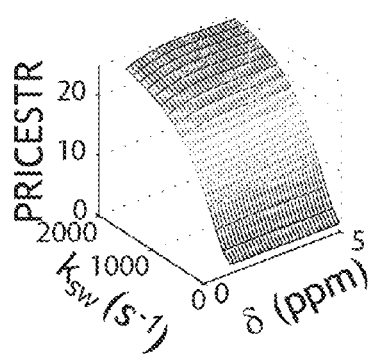
FIG. 16f shows PRICESTR as a function of exchange rates and chemical shifts.

Although both CESTR and PRICESTR are sensitive to exchange rate—not the CEST agent concentration, PRICESTR is less susceptible to variation in relaxation rates and chemical shifts. FIG. 16a shows rCESTR as a function of exchange rates and $T_1$, where rCESTR changes noticeably with $T_1$. FIG. 16b shows PRICESTR is substantially less susceptible to $T_1$ changes. FIG. 16c shows rCESTR as a function of exchange rates and $T_2$, where rCESTR changes noticeably with $T_2$ due to RF spillover effects at short $T_2$. FIG. 16d shows PRICESTR is substantially less susceptible to $T_2$ changes. FIG. 16e shows rCESTR as a function of exchange rates and chemical shifts, where rCESTR reduces substantially at small chemical shifts due to more pronounced RF spillover effects at those chemical shifts. FIG. 16f shows PRICESTR is substantially less susceptible to chemical shift changes.

rCESTR can be an accurate pH indicator and is simple to use as it only requires taking the ratio of CEST measurements obtained under two different RF power levels. In comparison, RF power (RFP)-CEST analysis of a prior attempted method enables separation of labile proton ratios from exchange rates, but requires multi-parameter non-linear fitting. In another method of a prior attempt, the RF spillover effect can be estimated and corrected to improve precision of omega plot analysis for diamagnetic CEST agents. Modified linear analysis methods can be used to estimate fast chemical exchange rates. However, all these prior methods require reasonable estimation of bulk water relaxation rates and regression analysis, which may prevent those methods from routine clinical use.

Concomitant effects, such as magnetization transfer (MT) and nuclear overhauser effects (NOE) can be taken into account when rCESTR imaging is translated into in vivo. For example, in renal pH imaging, the confounding RF irradiation effects can be delineated by monitoring MRI signal changes after contrast agent administration.

The system and method disclosed herein can be used to increase the accuracy of conventional ratiometrics for agents with multiple exchangeable sites. Agents with multiple sites, such as iopamidol and iopromide, can be used in CEST MRI of in vivo pH. In conventional ratiometric CEST MRI, ratios of CEST measurements from multiple sites using the same $B_1$ field are generated. The optimal $B_1$ level depends on exchange rates, pH, and the chemical shift differences between the exchangeable sites. As such, the applied $B_1$ may not be optimal for any site.

Therefore, different $B_1$ can be applied for different exchangeable sites or chemical shifts to enhance pH imaging. The frequency offset of the saturation pulse can be chosen as the chemical shift for an exchangeable site or a user-selected offset. This adds another dimension for optimizing and quantifying pH. Both rCESTR and PRICESTR can be used in this method.

The system and method as disclosed herein can increase the specificity and range of measured pH values. Referring to FIGS. 17a-17c, data using iopamidol at 4.7 T implementing the systems and methods of this configuration is provided. FIG. 17a shows the conventional ratiometric of CESTR (e.g., rCESTR(2.5 μT)=CESTR(4.3 ppm)/CESTR (5.5 ppm)), the ratio of two groups of labile protons at 4.3 and 5.5 ppm at the same saturation level. The conventional ratiometrics have a limited pH range from 6.0 to 7.0 and diminishing power to resolve pH between 7.0 and 7.5. In comparison, the generalized rCESTR index with modulation of both saturation level and offset (e.g., $rCESTR_{mod}$=CESTR(4.3 ppm, 2.5 μT)/CESTR(5.5 ppm, 4 μT)) demonstrates a substantial increase in both the range and sensitivity of pH imaging to a level sufficient for resolving pH between 6.0 and 8.0 (FIG. 17b). By choosing different $B_1$ levels for different chemical shifts, the range and sensitivity of pH measurements can be enhanced (FIG. 17c). This allows quantitative pH MRI to be translated to clinical scanners, which has lower field strengths than those for preclinical studies. In the case of overlapping CEST effects, the CEST signal can be decoupled from each other and concomitant saturation effects such as MT and (NOE) for ratiometric CEST imaging.

Throughout this application, terms have been denoted with symbols comprising letters and numbers. For example, $B_1$ denotes the irradiation RF power level. Across embodiments, the same symbol represents the same term and different symbols for the same term are interchangeable.

The present invention has been described in terms of one or more preferred embodiments, and it should be appreciated that many equivalents, alternatives, variations, and modifications, aside from those expressly stated, are possible and within the scope of the invention.

As used in the claims, the phrase "at least one of A, B, and C" means at least one of A, at least one of B, and/or at least one of C, or any one of A, B, or C or combination of A, B, or C. A, B, and C are elements of a list, and A, B, and C may be anything contained in the Specification.

The invention claimed is:

1. A method for assessing pH in a subject using a magnetic resonance imaging (MRI) system, comprising:
   a) generating, using the MRI system, a chemical exchange saturation transfer (CEST) pulse sequence comprising a saturating magnetic field used to saturate protons of the subject by irradiating the subject with the field, wherein the field has a frequency offset from a Lamar frequency of water protons, and the frequency offset is related to a contrast agent associated with the subject;
   b) performing the pulse sequence wherein the saturating magnetic field is at a first radio-frequency (RF) power level ($\omega_{11}$) and a first set of MR signals of the subject are acquired;
   c) performing the pulse sequence wherein the saturating magnetic field is at a second RF power level ($\omega_{12}$) different from $\omega_{11}$ and a second set of MR signals are acquired;
   d) generating first inverse CEST ratio and a second inverse CEST ratio of the subject using the first and the second set of MR signals; and
   e) generating a report indicating pH using the values based on a labile proton exchange rate, where the labile proton exchange rate is derived using RF-power based inverse CEST ratio (PRICESTR) between the first inverse CEST ratio and the second inverse CEST ratio.

2. The method as recited in claim 1, wherein the sequence generated in a) comprises:
   a first subpart including irradiating protons in the subject at a first frequency offset ($\Delta\omega$) equal to a chemical shift difference between a proton exchange site of the contrast agent and the Lamar frequency, and acquiring labeled MR signals ($I_{label}$);
   a second subpart including irradiating the protons at a second frequency offset ($-\Delta\omega$) that is opposite of the first frequency offset, and acquiring reference MR signals ($I_{ref}$); and
   a third subpart including turning off saturating magnetic field, and acquiring control MR signals $I_0$.

3. The method as recited in claim 2, wherein step e) includes:
   calculating an inverse CEST ratio (CESTR$_{ind}$) as CESTR$_{ind}$=$I_0/I_{label}$−$I_0/I_{ref}$ using each of the first and the second set of MR signals to generate the first inverse CEST ratio CESTR$_{ind}(\omega_{11})$ for the first set of MR signals and the second inverse CEST ratio CESTR$_{ind}(\omega_{12})$ for the second set of MR signals;
   calculating the PRICESTR as a ratio of CESTR$_{ind}(\omega_{11})$ and CESTR$_{ind}(\omega_{12})$;
   deriving the labile proton exchange rate based on the PRICESTR using a preset equation; and
   deriving the values indicating the pH based on the labile proton exchange rate.

4. The method as recited in claim 3, wherein the preset equation is:

$$k_{sw} = \frac{\sqrt{R_{2s}^2 + 4\omega_{11}^2 \cdot \omega_{12}^2 \cdot \frac{1 - PRICESTR}{\omega_{12}^2 \cdot PRICESTR - \omega_{11}^2}} - R_{2s}}{2},$$

where $k_{sw}$ is the labile proton exchange rate and $R_{2s}$ is a transverse relaxation rate of a solute.

5. The method as recited in claim 4, wherein a labile proton ratio is derived as:

$$f_r = \frac{R_{1w} \cdot (\omega_1^2 + k_{sw}(k_{sw} + R_{2s}))}{k_{sw} \cdot \omega_1^2} \cdot CESTR_{ind}(\omega_1),$$

where $\omega_1$ denotes the first RF power level $\omega_{11}$ or the second RF power level $\omega_{12}$, $\theta$=atan($\omega_1/\Delta\omega$), and $R_{1w}$ is a longitudinal relaxation rate of water.

6. The method as recited in claim 5, further comprising: deriving a concentration based on the labile proton ratio.

7. The method as recited in claim 2, wherein step e) includes:
   calculating a CEST ratio (CESTR) as CESTER=($I_{ref}$−$I_{label}$)/$I_0$ using each of the first and the second set of MR signals to generate a CESTR($\omega_{11}$) for the first set of MR signals and a CESTR($\omega_{12}$) for the second set of MR signals;
   calculating an RF-power based CEST ratio (rCESTR) as a ratio of CESTR($\omega_{11}$) and CESTR($\omega_{12}$);
   deriving a labile proton exchange rate based on the rCESTR using a second preset equation; and
   deriving the values indicating the pH based on the labile proton exchange rate.

8. The method as recited in claim 7, wherein the second preset equation is:

$$k_{sw} = \frac{\sqrt{R_{2s}^2 + 4\left(\frac{w_{12}^2 - w_{11}^2}{\left(\frac{(1-\sigma)|_{w_{12}}}{(1-\sigma)|_{w_{11}}}\right) \cdot \frac{w_{12}^2}{w_{11}^2} \cdot rCESTR - 1} - w_{11}^2\right)} - R_{2s}}{2},$$

where $k_{sw}$ is the labile proton exchange rate and $R_{2s}$ is a transverse relaxation rate of a solute, and (1−$\sigma$) indicates a spillover factor.

9. The method as recited in claim 7, wherein the first and the second RF power levels $\omega_{11}$ and $\omega_{12}$ are optimized by maximizing a relative contrast-to-noise ratio (rCNR), where $$rCNR = \frac{CNR}{SNR_{I_0}},$$

CNR is a contrast-to-noise ratio of the rCESTR, $SNR_{I_0}$ is a signal-to-noise ratio of the control MR signals $I_0$.

10. The method as recited in claim 7, wherein
   the contrast agent has two or more exchangeable sites;
   a frequency offset of the pulse sequence applied in step b) correspond to a chemical shift of a first exchangeable site or a first chosen offset;
   a frequency offset of the pulse sequence applied in step c) correspond to a chemical shift of a second exchangeable site or a second chosen offset.

11. A magnetic resonance imaging (MRI) system, comprising:
   a magnet system configured to generate a polarizing magnetic field about at least a portion of a subject arranged in the MRI system;
   a magnetic gradient system including a plurality of magnetic gradient coils configured to apply at least one magnetic gradient field to the polarizing magnetic field;
   a radio frequency (RF) system configured to apply an RF field to the subject and to receive magnetic resonance (MR) signals therefrom;
   a computer system programmed to:
   a) generate, using the MRI system, a chemical exchange saturation transfer (CEST) pulse sequence comprising a saturating magnetic field used to saturate protons of the subject by irradiating the subject with the field, wherein the field has a frequency offset from a Lamar frequency of water protons, and the frequency offset is related to a contrast agent associated with the subject;
   b) perform the pulse sequence wherein the saturating magnetic field is at a first radio-frequency (RF) power level ($\omega_{11}$) and a first set of MR signals of the subject are acquired;
   c) perform the pulse sequence wherein the saturating magnetic field is at a second RF power level ($\omega_{12}$) different from $\omega_{11}$ and a second set of MR signals are acquired;
   d) generate first inverse CEST ratio and a second inverse CEST ratio of the subject using the first and the second set of MR signals; and
   e) generate a report indicating pH using the values based on a labile proton exchange rate, where the labile proton exchange rate is derived using RF-power based inverse CEST ratio (PRICESTR) between the first inverse CEST ratio and the second inverse CEST ratio.

12. The system as recited in claim 11, wherein the sequence generated in a) comprises:
   a first subpart including irradiating protons in the subject at a first frequency offset ($\Delta\omega$) equal to a chemical shift difference between a proton exchange site of the contrast agent and the Lamar frequency, and acquiring labeled MR signals ($I_{label}$);
   a second subpart including irradiating the protons at a second frequency offset ($-\Delta\omega$) that is opposite of the first frequency offset, and acquiring reference MR signals ($I_{ref}$); and
   a third subpart including turning off the saturating magnetic field and acquiring control MR signals $I_0$.

13. The system as recited in claim 12, wherein d) includes calculating an inverse CEST ratio CESTR$_{ind}$, as CESTR$_{ind}$=I$_0$/I$_{label}$-I$_0$/I$_{ref}$ using each of the first and the second set of MR signals to generate the first inverse CEST ratio CESTR$_{ind}$($\omega_{11}$) for the first set of MR signals and the second inverse CEST ratio CESTR$_{ind}$($\omega_{12}$) for the second set of MR signals;
   calculating the PRICESTR as a ratio of CESTR$_{ind}$($\omega_{11}$) and CESTR$_{ind}$($\omega_{12}$);
   deriving the labile proton exchange rate based on the PRICESTR using a preset equation; and
   deriving the values indicating the pH based on the labile proton exchange rate.

14. The system as recited in claim 13, wherein the labile proton exchange rate in relation with the PRICESTR is characterized by the preset equation:

$$k_{sw} = \frac{\sqrt{R_{2s}^2 + 4\omega_{1a}^2 \cdot \omega_{1b}^2 \cdot \frac{1 - PRICESTR}{\omega_{1b}^2 \cdot PRICESTR - \omega_{1a}^2}} - R_{2s}}{2},$$

where $k_{sw}$ is the labile proton exchange rate and $R_{2s}$ is a transverse relaxation rate of a solute.

15. The system as recited in claim 14, wherein a labile proton ratio is derived as:

$$f_r = \frac{R_{1w} \cdot (\omega_1^2 + k_{sw}(k_{sw} + R_{2s}))}{k_{sw} \cdot \omega_1^2} \cdot CESTR_{ind}(\omega_1),$$

where $\omega_1$ denotes the first RF power level $\omega_{11}$ or the second power level $\omega_{12}$, $\theta$=atan($\omega_1/\Delta\omega$), and $R_{1w}$ is a longitudinal relaxation rate of water.

16. The system as recited in claim 15, wherein a concentration is derived based on the labile proton ratio.

17. The system as recited in claim 12, wherein d) includes calculating a CEST ratio (CESTR) as CESTR=($I_{ref}$-$I_{label}$)/$I_0$ using each of the first and the second set of MR signals to generate a CESTR($\omega_{11}$) for the first set of MR signals and a CESTR($\omega_{12}$) for the second set of MR signals;
   calculating an RF-power based CEST ratio (rCESTR) as a ratio of CESTR($\omega_{11}$) and CESTR($\omega_{12}$)
   deriving a labile proton exchange rate based on the rCESTR using a second preset equation; and
   deriving the values indicating the pH based on the labile proton exchange rate.

18. The system as recited in claim 17, wherein the labile proton exchange rate in relation with the rCESTR is represented by the second preset equation:

$$k_{sw} = \frac{\sqrt{R_{2s}^2 + 4\left(\frac{w_{12}^2 - w_{11}^2}{\left(\frac{(1-\sigma)|_{w_{12}}}{(1-\sigma)|_{w_{11}}}\right) \cdot \frac{w_{12}^2}{w_{11}^2} \cdot rCESTR - 1} - w_{11}^2\right)} - R_{2s}}{2},$$

where $k_{sw}$ is the labile proton exchange rate and $R_{2s}$ is a transverse relaxation rate of a solute, and $(1-\sigma)$ indicates a spillover factor.

19. The system as recited in claim 17, wherein the first and the second RF power levels $\omega_{11}$ and $\omega_{12}$ are optimized by maximizing a relative contrast-noise ratio (rCNR), where $$rCNR = \frac{CNR}{SNR_{I_0}},$$

CNR is a contrast-to-noise ratio of the rCESTR, $SNR_{I_0}$ is a signal-to-noise ratio of the control MR signals $I_0$.

20. The system as recited in claim 17, wherein
   the contrast agent has two or more exchangeable sites;
   a frequency offset of the pulse sequence applied in b) correspond to a chemical shift of a first exchangeable site or a first chosen offset;
   a frequency offset of the pulse sequence applied in c) correspond to a chemical shift of a second exchangeable site or a second chosen offset.

* * * * *